US006755150B2

(12) United States Patent
Lai et al.

(10) Patent No.: US 6,755,150 B2
(45) Date of Patent: Jun. 29, 2004

(54) MULTI-CORE TRANSFORMER PLASMA SOURCE

(75) Inventors: Canfeng Lai, Fremont, CA (US); Michael S. Cox, Davenport, CA (US); Peter K. Loewenhardt, Pleasanton, CA (US); Tsutomu Tanaka, Sana Clara, CA (US); Shamouil Shamouilian, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 181 days.

(21) Appl. No.: 09/839,360

(22) Filed: Apr. 20, 2001

(65) Prior Publication Data

US 2003/0085205 A1 May 8, 2003

(51) Int. Cl.[7] .......................... C23C 16/00; H05H 1/00
(52) U.S. Cl. ................ 118/723 I; 156/345.48
(58) Field of Search .................. 118/723 I, 723 IR, 118/723 AN; 156/345.48, 345.49, 345.46; 204/298.01; 315/111.01, 111.21, 111.41, 111.51

(56) References Cited

U.S. PATENT DOCUMENTS

| | | | |
|---|---|---|---|
| 3,291,715 A | 12/1966 | Anderson | 204/298 |
| 4,086,506 A | 4/1978 | Kustom et al. | 310/74 |
| 4,277,306 A | 7/1981 | Ohkawa | 176/9 |
| 4,431,898 A | 2/1984 | Reinberg et al. | 219/121 |
| 4,585,986 A | 4/1986 | Dyer | 323/271 |
| 4,666,734 A | 5/1987 | Kamiya et al. | 427/39 |
| 4,713,208 A | 12/1987 | Furth et al. | 376/137 |
| 4,859,399 A | 8/1989 | Bussard | 376/133 |
| 4,863,671 A | 9/1989 | Okada | 376/143 |
| 4,868,919 A | 9/1989 | Tanaka et al. | 355/27 |
| 5,014,321 A | 5/1991 | Klein | 381/111 |
| 5,041,760 A | 8/1991 | Koloc | 315/111.41 |
| 5,174,875 A | 12/1992 | Hurwitt et al. | 204/192.12 |
| 5,290,382 A | 3/1994 | Zarowin et al. | 156/345 |
| 5,464,476 A | 11/1995 | Gibb et al. | 118/723 MP |
| 5,505,780 A | 4/1996 | Dalvie et al. | 118/723 |
| 5,514,246 A | 5/1996 | Blalock | 156/643.1 |
| 5,560,776 A | 10/1996 | Sugai et al. | 118/723 AN |
| 5,591,493 A | 1/1997 | Paranjpe et al. | 427/569 |
| 5,619,103 A | 4/1997 | Tobin et al. | 315/111.21 |
| 5,632,869 A | 5/1997 | Hurwitt et al. | 204/192.12 |

(List continued on next page.)

FOREIGN PATENT DOCUMENTS

| | | | | |
|---|---|---|---|---|
| JP | 2-260399 | 10/1990 | | H05H/1/46 |
| JP | 5-144594 | 6/1993 | | H05H/1/46 |
| JP | 5-166595 | 7/1993 | | H05H/1/46 |
| WO | WO 90/10945 | 9/1990 | | H01J/27/16 |
| WO | WO 99/00823 | 1/1999 | | H01J/37/32 |

OTHER PUBLICATIONS

U.S. patent application Ser. No. 09/246,036, Chandran et al., filed Feb. 1999.

(List continued on next page.)

*Primary Examiner*—Parviz Hassanzadeh
(74) *Attorney, Agent, or Firm*—Townsend & Townsend & Crew

(57) ABSTRACT

A transformer-coupled plasma source using toroidal cores forms a plasma with a high-density of ions along the center axis of the torus. In one embodiment, cores of a plasma generator are stacked in a vertical alignment to enhance the directionality of the plasma and generation efficiency. In another embodiment, cores are arranged in a lateral array into a plasma generating plate that can be scaled to accommodate substrates of various sizes, including very large substrates. The symmetry of the plasma attained allows simultaneous processing of two substrates, one on either side of the plasma generator.

10 Claims, 16 Drawing Sheets

U.S. PATENT DOCUMENTS

| | | | |
|---|---|---|---|
| 5,811,022 A | 9/1998 | Savas et al. | 216/68 |
| 5,939,886 A | 8/1999 | Turner et al. | 324/464 |
| 5,998,933 A | 12/1999 | Shun'ko | 315/111.51 |
| 6,164,240 A | 12/2000 | Nikulin | 118/723 I |
| 6,392,351 B1 * | 5/2002 | Shun'ko | 315/111.51 |
| 6,432,260 B1 * | 8/2002 | Mahoney et al. | 156/345.35 |
| 6,486,431 B1 * | 11/2002 | Smith et al. | 219/121.57 |

OTHER PUBLICATIONS

S. O. Dean et al., "Status and Objectives of Tokamak Systems for Fusion Research," *USERDA Report WASH–1295*, (1974) (available from the Superintendent of Documents, U.S. Government Printing Office) pp. i–106.

H.P. Furth, "Tokamak Research," *Nuclear Fusion*, 15, pp. 487–534 (1975).

H.U. Eckert, "Induction Plasmas at Low Frequencies," *AIAA Journal*, vol. 9, No. 8, pp. 1452–1456 (Aug. 1971).

M.O. Hagler et al., "An Introduction to Controlled Thermonuclear Fusion," *Library of Congress Cataloging in Publication Data*, pp. 59–61 and 178 (1977).

E. Kändler et al., "Characterization of Plasma in an Inductively Coupled High–Dense Plasma Source," *Surface and Coatings Technology*, 74–75, pp. 539–545 (1995).

\* cited by examiner

MULTI-CORE TRANSFORMER PLASMA SOURCE

BACKGROUND OF THE INVENTION

Plasmas are used for a variety of purposes in the fabrication of semiconductor devices, such as integrated circuits, and other types of substrates, such as micro-electromechanical ("MEMs") substrates to achieve a variety of results. Plasma methods include the formation of a layer using plasma-enhanced chemical vapor deposition and etching techniques, such as reactive ion etching. A plasma might also be used to clean a processing chamber, or to prepare a surface of a substrate for a subsequent process step, such as a plasma wafer surface clean or activation prior to formation of a layer on the surface. Plasma generators are also used as a source of ions for ion implantation or ion milling. A directed plasma might also be used as a plasma torch for cutting applications.

The wide application of plasma processing has resulted in a wide variety of plasma processing systems and apparatus. One type of plasma processing chamber places the wafer on an electrode of the plasma circuit, opposite another planar electrode, and capacitively couples high-frequency electrical power to the two electrodes to form a plasma between them. Such a plasma reactor has advantages where it is desirable to form the plasma in the presence of the substrate, such as when the physical movement of plasma species to and from the substrate is desired. However, some devices or materials might not be compatible with this type of plasma formation, particularly the bombardment by plasma species, including high-energy photons, and associated heating of the substrate.

Another approach to plasma processing generates plasma in a remote location, and couples the plasma to a processing chamber. Various types of plasma generators have been developed, including magnetron sources coupled to a cavity, inductively coupled toroidal sources, microwave irradiation directed at a plasma precursor, electron-cyclotron resonance generators, and others. Remote plasma techniques offer a number of advantages for certain types of processes, such as cleaning deposition chambers, but generally the plasma that eventually reaches the chamber is of relatively low density, due to recombination of the reactive plasma species with each other or with components of the processing system, such as the chamber walls or delivery conduit.

Inductively coupled plasma systems have been developed that can generate a high-density plasma in one portion of the processing chamber (e.g. above the wafer), yet shield the wafer from the more deleterious effects of the plasma generation process by using the plasma itself as a buffer between the wafer and the plasma generation region and typically relies on diffusion of plasma to provide a uniform ion density across the wafer surface. In one system, a dielectric dome, or chamber top, has a conductive coil wound around the dome. High-frequency electric energy provided to the coil couples to a plasma precursor gas in the chamber and converts the precursor to plasma. In some systems, a second power supply couples an alternating field to the wafer or wafer support structure, and allows a directional component to and from the wafer to be added to the plasma generated by the coils. Such systems are used for both deposition and etch processes to achieve very desirable results, generally providing both high rates and good uniformity across a wafer.

However, the fields generated by the coil through the dome have an electric field component normal to the surface of the dome that causes plasma species to be directed to and from the inner surface of the dome. This field component acting on the plasma can cause physical erosion ("sputtering") of the inside of the dome, as well as affect the power coupling to the plasma, thus causing a non-uniform plasma density. In some instances the plasma might contain species that react with the material of the dome, further eroding the dome and potentially creating particles than can fall from the dome onto the wafer, creating defects. Reaction of the dome material with the plasma often arises in an etch process when the material being etched is similar to the material of the dome, e.g. silica-based glass. If erosion of the inner surface of the dome continues to a point where particulate contamination or strength of the dome is an issue, the dome might have to be replaced, affecting throughput of the plasma system, and potentially disrupting the product flow through an entire fabrication line.

Transformer plasma sources have also been developed using a toroidal core. The core is typically a ferrite or similar high-permeability material, and the plasma source acts generally like an alternating-current ("AC") transformer. Primary windings are wound around the core and an induced plasma flux around the core acts like a secondary winding (s), the plasma flux providing a secondary current to oppose the magnetic fields in the core. In one system, a tube structure forms a continuous closed path ("loop") that includes a leg through a center opening of the core for transformer-coupled plasma. Another leg includes a gas inlet, and the same or another leg provides a plasma/gas outlet. In another embodiment, one leg of the plasma loop includes the gas inlet, gas/plasma outlet, and a process wafer. Plasma formed in the loop is carried past the wafer surface by the gas flow from the inlet to the outlet.

However, recombination of plasma species on the surface of the tubes or in the gas/plasma mixture can reduce the effectiveness of a plasma source. Recombination generally occurs to a greater degree where the distance between the plasma core, where the fields that generate the plasma are generally higher, to the process chamber are greater. Recombination can also affect plasma density, as can dilution with a process gas stream. When performing a plasma or plasma-assisted process on a wafer surface it is generally desirable to have a uniform plasma so that the surface of the wafer is uniformly processed. Uniformity problems are generally greater with larger-sized wafers.

Thus, it is desirable to provide a plasma system that avoids the surface erosion problem of conventional systems while creating a high-density, uniform plasma.

SUMMARY OF THE INVENTION

Embodiments of the present invention provide a plasma processing apparatus applicable to deposition, etch, cleaning processes, ion implantation, ion milling, and plasma torch applications. Such processes may be applied to a substrate, such as a silicon wafer, composite wafer, glass panel, or other materials. In some instances, the plasma generated by the apparatus might be used for chamber cleaning purposes, in the absence of a substrate.

A multi-core plasma source forms a number of poloidal plasma currents. In some embodiments, the cores are essentially parallel to each other, i.e. the center axis of the core tori are essentially parallel to each other in a "flat" configuration. In other embodiments, the cores are in a series, or "stacked" configuration. In one flat configuration, a number of relatively small plasma-generating transformer cores are arrayed across a double-walled panel. The panel has a number of through holes, some surrounded by transformer cores, and some providing a return path for the plasma generated by the cores. The panel provides a uniform plasma across a relatively large surface area, and can be scaled to larger sizes. Similarly, plasma uniformity can be improved by increasing the number of cores and through holes. The multi-core panel can be driven by a variety of AC, radio-frequency ("RF"), or microwave ("MW") sources. The transformers efficiently generate plasma from a variety of precursors over a wide range of pressures. In another embodiment, the panel is curved, rather than flat.

In another embodiment, two substrates are simultaneously processed in a plasma chamber using the symmetry achieved by toroidal plasma generators. A plasma processing system includes two substrate support structures that each hold a substrate facing each other with a transformer-coupled plasma generator between them.

In yet other embodiments, various configuration of transformer-coupled plasma generators are provided using multiple cores. In some embodiments the multiple cores promote conversion of the precursor into plasma by providing additional plasma generating zones. In other embodiments, the plasma produced by the cores achieves a higher directionality by aligning the cores in a vertical stack. In some embodiments the plasma generators are external to a processing chamber, being coupled to the processing chamber with a conduit, and in other embodiments the processing chamber completes a current path for the secondary circuit of the transformer-coupled plasma generator.

In yet another embodiment, an ion source for an ion implantation system utilizes the directional nature of the ion distribution along the centerline of the toroidal plasma generators by ejecting a portion of the ions produced toward extraction electrodes. This is believed to allow optimizing extraction gradients for mass/charge analyzer performance while providing a high ion flux for implantation.

In yet another embodiment, a toroidal plasma generator is placed in a plasma torch head. The plasma generator is encased within an inner nozzle, thus protecting the operator from electrical shock hazard. The poloidal current flow minimizes erosion of the inner nozzle material. It is believed that the toroidal plasma generator will produce plasma from a wide variety of precursors over wider pressure ranges and flow rates than conventional arc-discharge plasma generators.

In yet another embodiment, an ion source for an ion milling system utilizes the directional nature of the ion distribution along the centerline of the toroidal plasma generators by ejecting a portion of the ions produced toward accelerator plates. It is believed that the transformer-coupled toroidal plasma generator will provide a high flux of ions and that the high-density nature of the plasma along the centerline will improve the performance of the ion milling system.

These and other embodiments of the present invention, as well as its advantages and features, are described in more detail in conjunction with the text below and attached figures.

DESCRIPTION OF THE SPECIFIC EMBODIMENTS

I. Introduction

Embodiments of the present invention produce a plasma from multiple cores to achieve various beneficial effects. In one embodiment, many small cores are used to achieve a uniform plasma over a large surface area. In another embodiment, multiple cores are used to provide a high plasma density with a compact, efficient plasma generator. In another embodiment, the directionality of the plasma is used to provide an efficient source of ions for ion implantation. In yet another embodiment, the temperature profile of the plasma across the center of the core provides a compact, efficient plasma torch. These and other aspects of the invention will be further understood in light of the specific embodiments discussed below and reference to the accompanying figures. It is understood that other embodiments may be utilized and structural changes may be made without departing from the scope of the present invention.

II. Exemplary Substrate Processing System

Figure 1A:
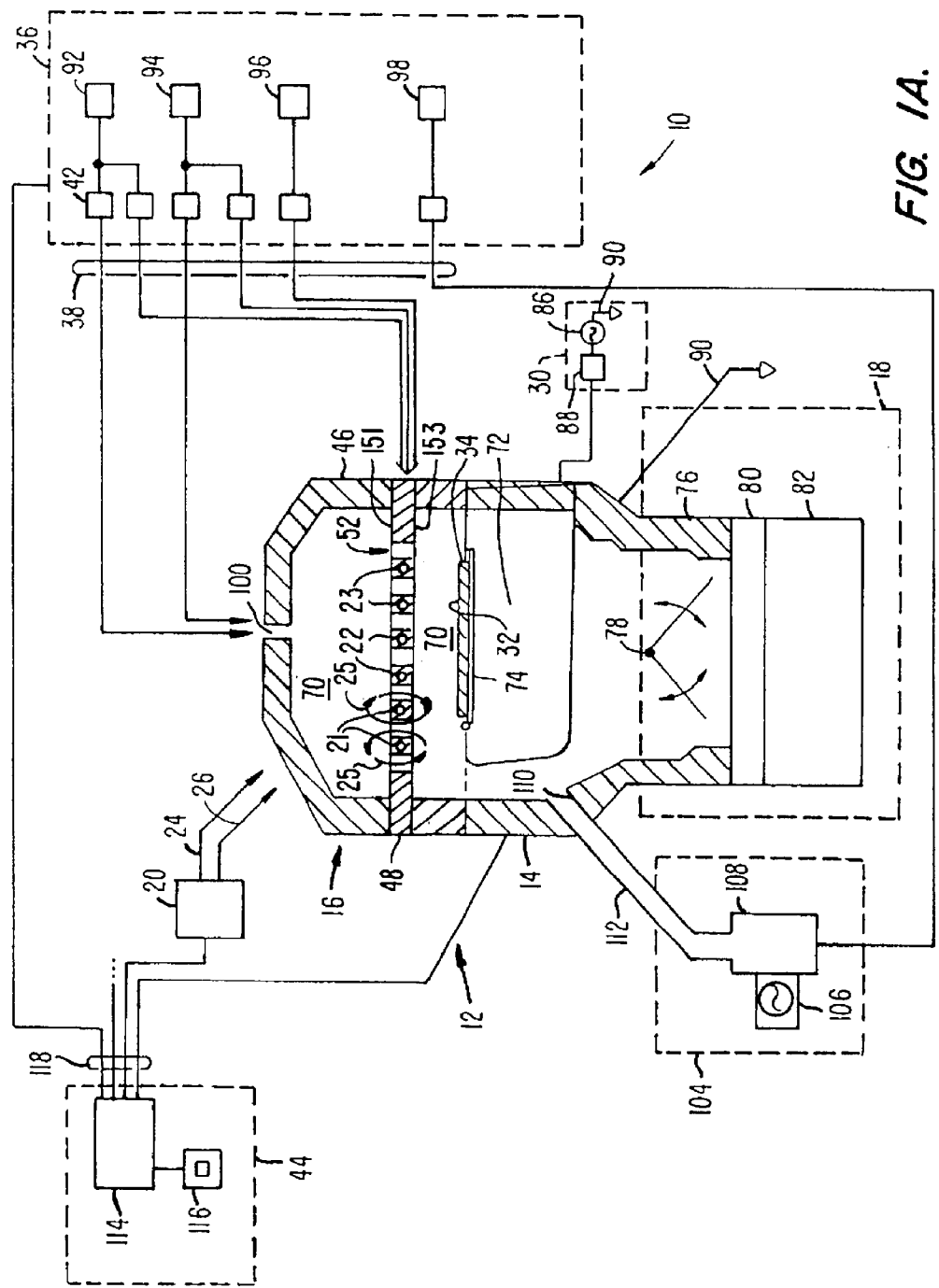
FIG. 1A is a simplified diagram of a plasma processing system with a multi-core plasma generator plate according to an embodiment of the present invention.

FIG. 1A illustrates one embodiment of a plasma processing system 10 suitable for a variety of plasma processes, such as plasma-enhanced deposition processes and plasma etch processes performed on a substrate or wafer. Plasma processing system 10 includes a chamber 12 having a chamber body 14 and a chamber top 16, a vacuum system 18, an alternating current ("AC") power supply 20, such as an RF generator, is coupled to a several toroidal cores 21, 22, 23 by leads 24, 26 and primary coils (not shown) wound around the cores. In a preferred embodiment the toroidal core 22 is a ferrite core, but could be other magnetic material, or merely free space ("air") depending on the coupling structure. As an optional bias plasma system 30 can produce movement in the plasma normal to the surface 32 of a substrate 34 or be used to initiate a plasma. Other plasma initiators, such as a spark discharge, direct current ("DC") electrode, or ultra-violet ("UV") source may be used. The substrate could be a silicon wafer, semiconductor-on-insulator, glass substrate, or other substrate for example. For ease of description, the surface 32 will be referred to as the "process surface" of the substrate. It is understood that the process surface may include layers and structures previously formed on the substrate. In certain embodiments, the wafer is a silicon wafer with a nominal diameter of 200 mm or 300 mm.

A gas delivery system 36 provides gas(es) to the processing chamber and other system components through gas delivery lines 38, only some of which might be shown. Typical gases provided by the gas delivery system 36 might include plasma precursor gases, such as a cleaning or etching plasma precursor gas, a plasma deposition precursor gas, plasma striking gas, plasma dilution gas, and other gases, such as a cleaning precursor gas provided to an optional remote plasma cleaning system 104, for example. The delivery lines generally include some sort of control, such as a mass flow controller 42 and shut-off valves (not shown). The timing and rate of flow of the various gases is controlled through a system controller 44, as will be described in further detail below.

The chamber top 16 includes an outer shell 46. A plasma generator plate 48 is installed between the outer shell and the chamber body 14. The plasma generator plate has a number of through holes 52 that allow gas and plasma to pass through the plate. The magnetic field inside the ferrite cores 21, 22, 23 within the plate drive the secondary plasma current inside the chamber when energized by the AC power supply 20 through the leads 24, 26. Primary windings (not shown) around each core couple the AC power to the core. The primary windings can be connected to the AC power supply in series, in parallel, or in a combination of series and parallel connections.

The plate can be made of dielectric materials, such as ceramic, fused silica, or organic polymer, or can be made primarily of metal, such as stainless steel or aluminum alloy with a dielectric gap or spacer to disrupt unwanted currents through the metal around the core. Each toroidal core produces an alternating poloidal plasma flow in the direction of the arrows 25 (during one half cycle) around the core through the through holes, and in the other direction during the other half cycle. The poloidal plasma flow is essentially piece-wise parallel to the surfaces of the generator plate, thus reducing sputtering of those surfaces.

In some embodiments, plasma formed by more than one core may couple in an additive or subtractive manner in a through hole, in other embodiments, such coupling is negligible because of the distribution of cores and through holes. For purposes of discussion, a through hole with a core surrounding it will be referred to as a generator hole, and a through hole without a core surrounding it will be referred to as a return hole. The return hole or holes generally completes the plasma current loop around the core.

In one embodiment the toroidal cores are made of a ferrite material, such as a material sold under the trade designation "3C90" by ROYAL PHILIPS ELECTRONICS, N.V., but other ferrites or other materials, such as iron, may be appropriate, or the primary winding can define a core with a dielectric material or even a void, for example.

The AC power supply is coupled to the cores by the leads 24, 26 that are electrically connected to the primary windings around the cores. The AC power supply could operate at a variety of frequencies, such as about 400 kHz, 10 MHz, 13.5 MHz, or 60 MHz. Although two leads are shown connecting the AC power supply to the cores, an alternative circuit configuration using a single lead and common ground could be used. Specifically, the power supply could be mounted directly on the chamber structure, thus avoiding long leads to the coil and associated electromagnetic radiation, as well as reducing variations in load resulting from long leads. Each core, primary coil, and generated plasma form a transformer circuit that operates as a toroidal transformer plasma source within the interior 70 of the processing chamber when in operation. The primary circuit of the transformer is the coil, with the plasma serving as the secondary circuit of the transformer, the primary coupling to the secondary through the core.

As described above, the outer shell 46 and chamber body 14 can be made of a conductive material, thus serving as a shield for electronic emissions generated by the transformer plasma sources, since each transformer plasma source is within the processing chamber. This not only reduces unwanted emissions from the system, but also may allow the AC power supply 20 to operate at frequencies that would otherwise generate an unacceptable level of electronic noise emissions. In such an embodiment, it may be desirable to provide leads from the power supply to the chamber that are shielded. The efficient coupling of the transformer plasma source(s) also allow a plasma to be generated over a wide range of pressure, such as from about 500 mTorr to 3 Torr, and can generate plasma from a wide variety of precursors.

The chamber body 14 includes a substrate support member 72, which is mounted on, and forms a continuous inner surface with, the body. Substrates are transferred into and out of chamber by a robot blade (not shown) through an insertion/removal opening (not shown) in the side of the chamber. Motor-controlled lift pins (not shown) are raised and then lowered to transfer the substrate from the robot blade to the substrate support member 72. A substrate receiving portion 74 of the substrate support member can include a wafer hold-down apparatus, such as an electrostatic chuck (not shown), that can selectively secure the substrate to the substrate support member during substrate processing, if desired. In a preferred embodiment, the substrate support member 72 is made from anodized aluminum, aluminum, or aluminum oxide. The substrate support member may also include a heater (not shown) to heat the wafer during processing, or to heat portions of the chamber during a cleaning process. In a preferred embodiment, the substrate support member holds the substrate 34 so that the processing surface 32 of the substrate is opposite and essentially parallel to the major plane of the plasma generator plate.

The vacuum system 18 includes a throttle body 76 that houses a twin-blade throttle valve 78 and is attached to a gate valve 80 and turbo-molecular pump 82. It should be noted that the throttle body 76 offers minimum obstruction to gas flow, and allows symmetric pumping, as described in co-pending, co-assigned U.S. patent application Ser. No. 08/712,724 entitled SYMMETRIC CHAMBER by Ishikawa, filed Sep. 11, 1996, and which is incorporated herein by reference.

The gate valve can isolate the turbo-molecular pump from the throttle body, and can also control chamber pressure by restricting the exhaust flow capacity when the throttle valve 78 is fully open. The arrangement of the throttle valve, gate valve, and turbo-molecular pump allow accurate and stable control of chamber pressures from between about 1 mTorr to about 3 Torr, depending on gas flow rates. It is understood that other types of vacuum pumps and configurations of vacuum systems could be used with alternative embodiments of the present invention.

The AC power supply 20 operates at a nominal frequency of 400 KHz, but could operate at different frequencies, such as 60 Hz, 2 MHz, 13.56 MHz, 60 MHz, or 200 MHz, with appropriate design of the elements of the plasma system. The power supply can supply up to 8 kW, but the processing system typically draws about 3–5 kW when processing a 200 mm wafer. It is understood that lower or higher power levels might be appropriate according to the type of process being performed and the size of the substrate.

A particular advantage of embodiments of the present invention utilizing multiple ferrite cores is the relatively low quality factor ("Q") of the toroidal plasma generating structures (primary-core-secondary (plasma loop)). The low Q allows a high-frequency plasma generation system without the need for complicated matching circuits, as might be required with higher-Q systems. The low Q also reduces the sensitivity of the plasma system to the chamber load, thus resulting in a more stable and consistent plasma operated over a wider process range.

In a high-Q system, the power delivered to the plasma can vary as the plasma is formed or chamber conditions change. For example, a plasma might be initiated with a plasma striker gas, such as argon. When a precursor gas, such as $NF_3$ or F2, is provided to the plasma, the dissociation of the gas into plasma creates a sudden increase in plasma species (pressure) as well as electrically charged particles. This effect can change the load on the power supply as well as the match to the load, resulting in reduced power transfer to the plasma and potentially reflecting a harmful level of power back to the generator. In the present invention, a low-Q system can be implemented, avoiding these problems.

The optional bias plasma system 30 includes a bias generator 86 and an optional bias-matching network 88. The bias plasma system capacitively couples the substrate receiving portion 74, i.e. the substrate, to conductive (grounded) inner surfaces of the chamber through a common ground 90. The bias plasma system serves to enhance the transport of plasma species (e.g. reactive ions or other particles) created by the plasma generating plate 48 to the surface 32 of the substrate.

The gas delivery system 36 provides gases from several gas sources 92, 94, 96, 98 to the chamber and other system components via the gas delivery lines 38 (only some of which might be shown). Gases can be introduced into the chamber in a variety of fashions. For example, a top port 100 is shown as one example of a means for flowing gases in to the chamber. A gas mixing chamber (not shown) can be present between the gas sources and the chamber, or the top port can be arranged with a number of parallel or concentric gas conduits to keep various gases separate until reaching the chamber. In an alternate embodiment, gas conduits are present around the perimeter of the chamber, either above or below the plasma generating plate. In yet an alternative embodiment, a gas delivery ring with a series of gas nozzles is provided about an inner circumference of the processing chamber. Gas generally flows from the gas inlet port(s) to the vacuum exhaust system 18. This flow can also carry plasma species generated by the plasma generator plate toward the surface of the substrate. In other instances, the process wafer might be placed close enough to the plasma generating plate that gas flow is not required for plasma processing of the wafer surface.

An optional remote plasma cleaning system 140 is provided to periodically clean deposition residues from chamber components. The cleaning system includes a remote microwave or RF plasma generator 106 that creates a plasma from a cleaning gas source 98 such as molecular fluorine, nitrogen trifluoride, other fluorocarbons or equivalents, in a reactor cavity 108. The reactive species resulting from this plasma are conveyed to the chamber interior through cleaning gas feed port 110 via applicator tube 112.

The system controller 44 controls the operation of the plasma processing system 10. In a preferred embodiment, the system controller includes a processor 114 coupled to a memory 116, such as a hard disk drive, a floppy disk drive (not shown), and a card rack (not shown). The card rack may contain a single-board computer (SBC) (not shown), analog and digital input/output boards (not shown), interface boards (not shown), and stepper motor controller boards (not shown). The system controller is coupled to other parts of the processing system by control lines 118 (only some of which might be shown), which may include system control signals from the controller and feedback signals from the system. The system controller conforms to the Versa Modular European (VME) standard, which defines board, card cage, and connector dimensions and types. The VME standard also defines the bus structure having a 16-bit data bus and 24-bit address bus.

An example of a system which may incorporate some or all of the subsystems and routines described above would be the ULTIMA™ system, manufactured by APPLIED MATERIALS, INC., of Santa Clara, Calif., configured to practice the present invention. Further details of such a system are disclosed in U.S. patent application Ser. No. 08/679,927, filed Jul. 15, 1996, entitled "Symmetric Tunable Inductively-Coupled HDP-CVD Reactor," having Fred C.

Redeker, Farhad Moghadam, Hirogi Hanawa, Tetsuya Ishikawa, Dan Maydan, Shijian Li, Brian Lue, Robert Steger, Yaxin Wang, Manus Wong and Ashok Sinha listed as co-inventors, the disclosure of which is incorporated herein by reference.

It is specifically understood that other types of chambers might be adapted to a multi-core toroidal plasma source according to the present invention, and that different types of wafer support systems, such as a center pedestal, might be used, as well as different exhaust configurations, such as a perimeter exhaust configuration. Similarly, additional coils might be added to control the plasma density and distribution (uniformity) inside the processing chamber. For example, instead of the metal outer shell described in conjunction with FIG. 1A, a dielectric dome or shell could be used, and a coil provided outside the chamber, or a coupling structure (s), such as a pole face of a solenoid, could couple to the interior of the chamber through a chamber wall. Although the plasma generator plate is illustrated as a flat plate, it could form a hemisphere or other shape.

III. Planar Multi-core Internal Plasma Generating Plate

Figure 1B:
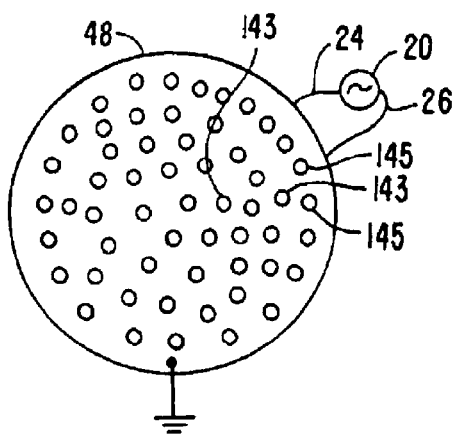
FIG. 1B is a simplified top view of a multi-core plasma generator plate according to an embodiment of the present invention.

FIG. 1B is a simplified top view of a multi-core plasma generator plate 48 according to an embodiment of the present invention. The plate may be flat, curved, or otherwise shaped. The plate includes a plurality of holes forming conduits through the plate for the passage of gas and plasma. Within the plate are several toroidal cores with a primary coil for each core. Some of the holes 143 pass through the center of a toroidal transformer core, while others 145 do not pass through a transformer core but provide return paths for the plasma current to complete the secondary circuit. Holes that pass through a transformer core can also provide a return path for the plasma current in another transformer circuit. In one embodiment half the holes pass through a transformer core and the other half do not. In another embodiment, one fourth of the holes pass through a core and three fourths do not. Other ratios may be selected. In one embodiment, holes around the outmost edge are through a transformer core while center holes are through holes. The plasma generating plate is typically intended to be placed within a processing chamber, such as is shown in FIG. 1A, above, and FIG. 2A, below. Hole diameter can be optimized for different processes as determined by mean free path and sheath thickness. In some embodiments, a larger hole diameter is used for low pressure operation and a smaller hole diameter for high pressure processes.

An AC power supply 20 provides current to the primary coils in the array through leads that are coupled to the primary coils. The primary coils can be directly attached to the leads, or one side of each coil can be connected to a common ground with one side of the power supply. The plate may be grounded as shown, or floating, or at a selected potential. In one embodiment, a bias voltage is applied between the plasma generator plate and a process wafer to provide additional control of the plasma.

Figure 1C:
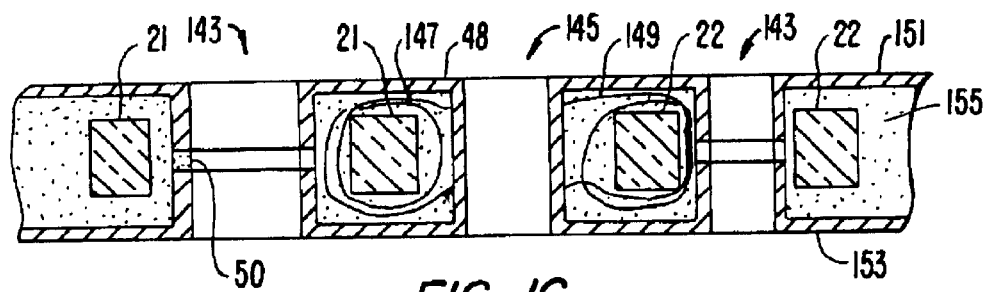
FIG. 1C is a simplified cross section of a portion of the multi-core plasma generator plate shown in FIG. 1B.

FIG. 1C is a simplified cross section of a portion of the multi-core plasma generator plate shown in FIG. 1B. Ferrite cores 21, 22 are coupled to primary coils 147, 149, which are connected to an AC power source (not shown in this figure). The surfaces 151, 153 of the plate are generally fabricated from a metal, such as aluminum or anodized aluminum. Other metals can be selected according to the intended process, for example, stainless steel may be used in applications where the risk of contamination from the elements in the steel is low. An insulative spacer 50 breaks the electrical path around the core(s) through the plate to disrupt eddy currents. Alternatively, the surfaces of the plate could be made of a non-conductive material. The cores are packed in a packing material 155, such as polyamide resin or magnesium oxide, to reduce the movement of the coils after assembly. Packing material can also serve to electrically insulate the primary coils and associated wiring from the conductive portions of the generator plate. The packing material can be applied as a powder, as a liquid, such as silicon oil, as a liquid that is then polymerized, such as polyamide resin, or can be applied in a series of steps, such as applying a sheet of durable electrical insulation on which the cores and coils are placed, then filling in the spaces between the cores and conduits with a liquid or powder, and then applying a second sheet of durable electrical insulation before sealing the generator plate. The generator plate may have additional features, such as liquid or gas cooling, which is not shown for simplicity of illustration.

Figure 1D:
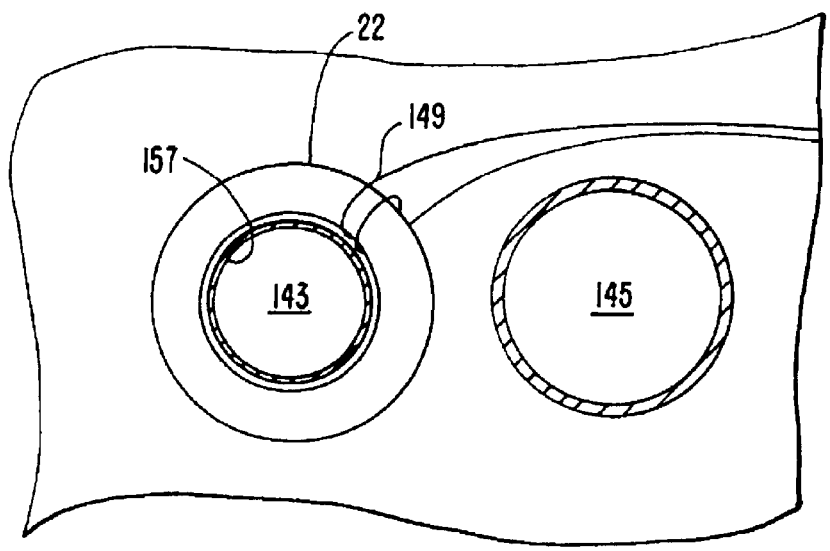
FIG. 1D is a simplified top view of a portion of the multi-core plasma generator plate shown in FIG. 1B with a surface of the plate removed to illustrate internal details of the plate.

FIG. 1D is a simplified top view of a portion of the plasma generator plate shown in FIGS. 1B and 1C with a surface of the plate removed to illustrate interior details of the plate. A toroidal core 22 surrounds a hole 143 formed by the wall of the conduit 157. A primary coil 149 couples electromagnetic energy to the core 22, which couples to plasma outside the generator plate. The plasma flow acts as a secondary circuit to complete the transformer coupling from the AC power supply (not shown in this figure) to the plasma. Another hole 145 does not have a surrounding core, and allows plasma flow through the hole to complete the secondary circuit.

Figure 1E:
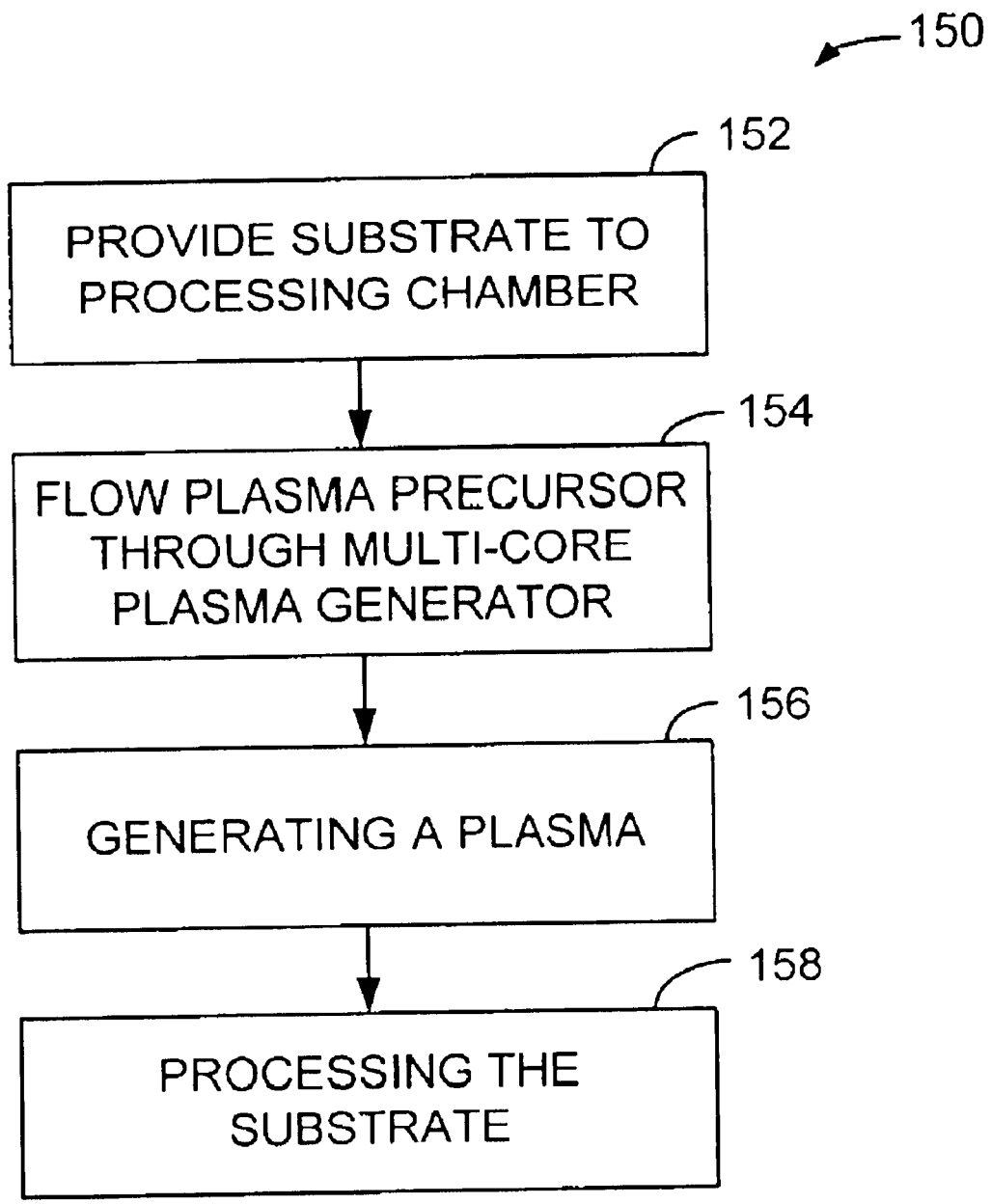
FIG. 1E is a simplified flow chart of a method of processing a substrate according to an embodiment of the present invention.
Figure 2A:
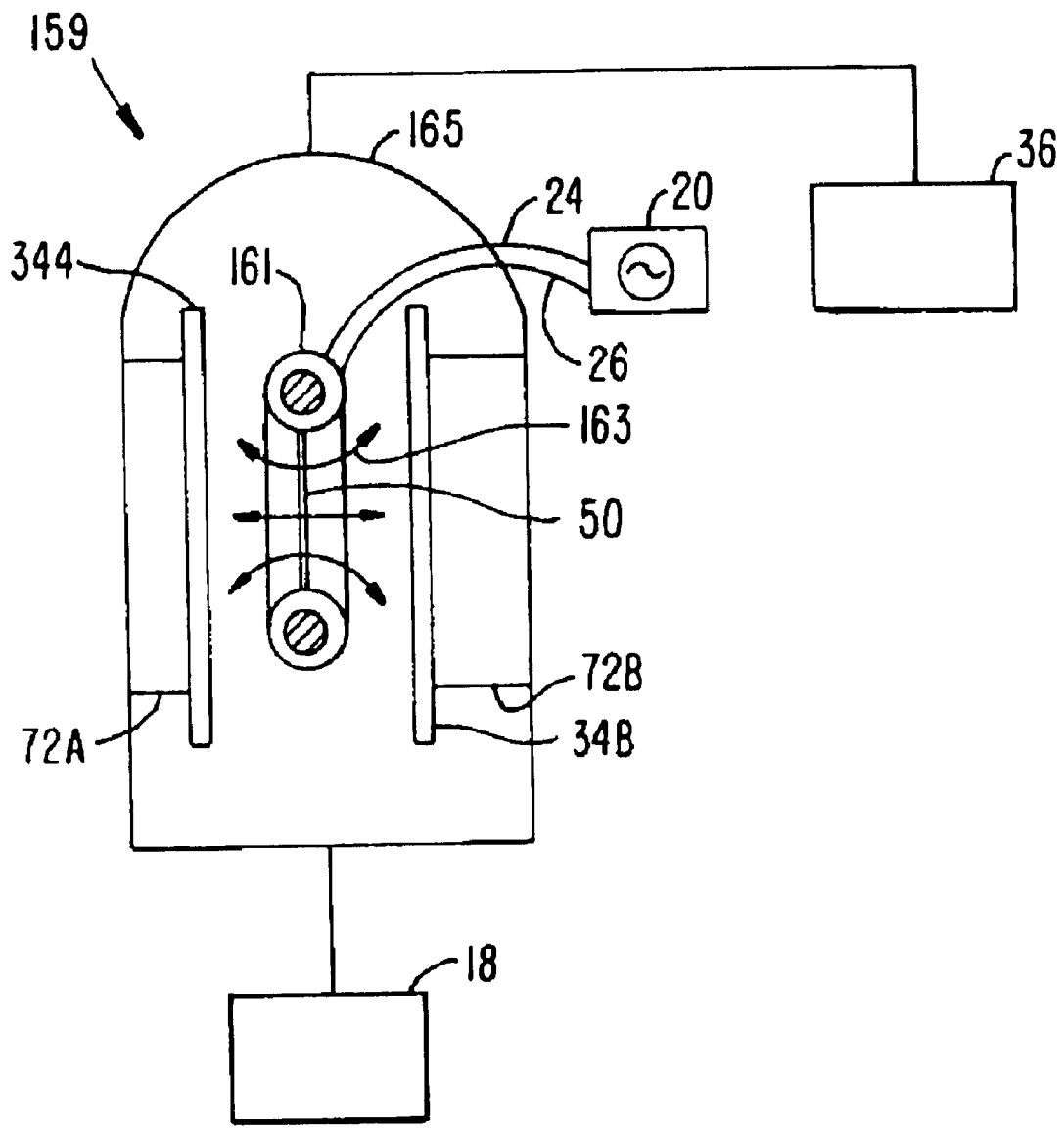
FIG. 2A is a simplified diagram of a multi-wafer processing system with an internal toroidal plasma source according to another embodiment of the present invention.

FIG. 1E is a simplified flow chart of a method of processing a substrate 150 according to an embodiment of the present invention. A substrate is placed in a processing chamber (step 152) and plasma precursor is flown into a multi-core transformer-coupled plasma generator (step 154). The generator (i.e. primary coil, core, and secondary plasma circuit path) may lie entirely within the processing chamber such as illustrated in FIGS. 1A and 2A, or may be outside of the chamber, such as illustrated in FIGS. 3A–3F. In some cases the external plasma generator is coupled to the processing chamber through a conduit, in other cases the processing chamber completes the secondary plasma current path around the core. The plasma generator forms a plasma from the plasma precursor (step 156) to plasma process the wafer (step 158). Examples of suitable plasma processes include etching, plasma-assisted thin-film formation, and surface activation.

IV. A Multi-Wafer Plasma Processing System

FIG. 2A is a simplified diagram of a multi-wafer processing system 159 with an internal toroidal plasma source 161 according to another embodiment of the present invention. The internal plasma source is shown as a single-core source, but a multi-core source, such as is described in conjunction with FIGS. 1A, 1B, 1C and 1E, could be used. An internal plasma source with a single core is described in U.S. application Ser. No. 09/584,167, entitled TOROIDAL PLASMA SOURCE FOR PLASMA PROCESSING, by Cox et al., filed May 25, 2000, the disclosure of which is hereby incorporated in its entirety for all purposes. In either case, the toroidal plasma source is a symmetrical source. That is, the plasma current flows essentially equally in both directions through the center of the torus (tori), as represented by the double-ended arrow 163.

A gas source 36 supplies gas to the process chamber 165. An AC power supply 20 provides current to a primary coil (not shown in this figure) and the toroidal plasma source 161 forms plasma from the gas. The exhaust system 18 removes effluent from the chamber. Two wafers 34A, 34B opposite each other with the symmetrical plasma source in between the wafers. The plane that the toroidal core lies in (the plane of intersection) is essentially parallel to the surface of each wafer. The wafers are held with wafer supports 72A, 72B, which can be mechanical supports, such as pockets or clips, vacuum chucks, or electrostatic chucks, for example. Although the wafers are shown in a vertical orientation, other orientations are possible.

When a single torus source is employed, generally a larger diameter of the center opening provides better plasma uniformity. For some 200 mm wafer processing embodiments, a 10 inch or larger diameter opening is used. For some 300 mm wafer processing embodiments a 16 inch or larger diameter opening is used. The distance between wafer and source depends on uniformity which in turn depends on gases, pressure and power. Some embodiments add a gas distribution ring to the torus to improve uniformity.

Figure 2B:
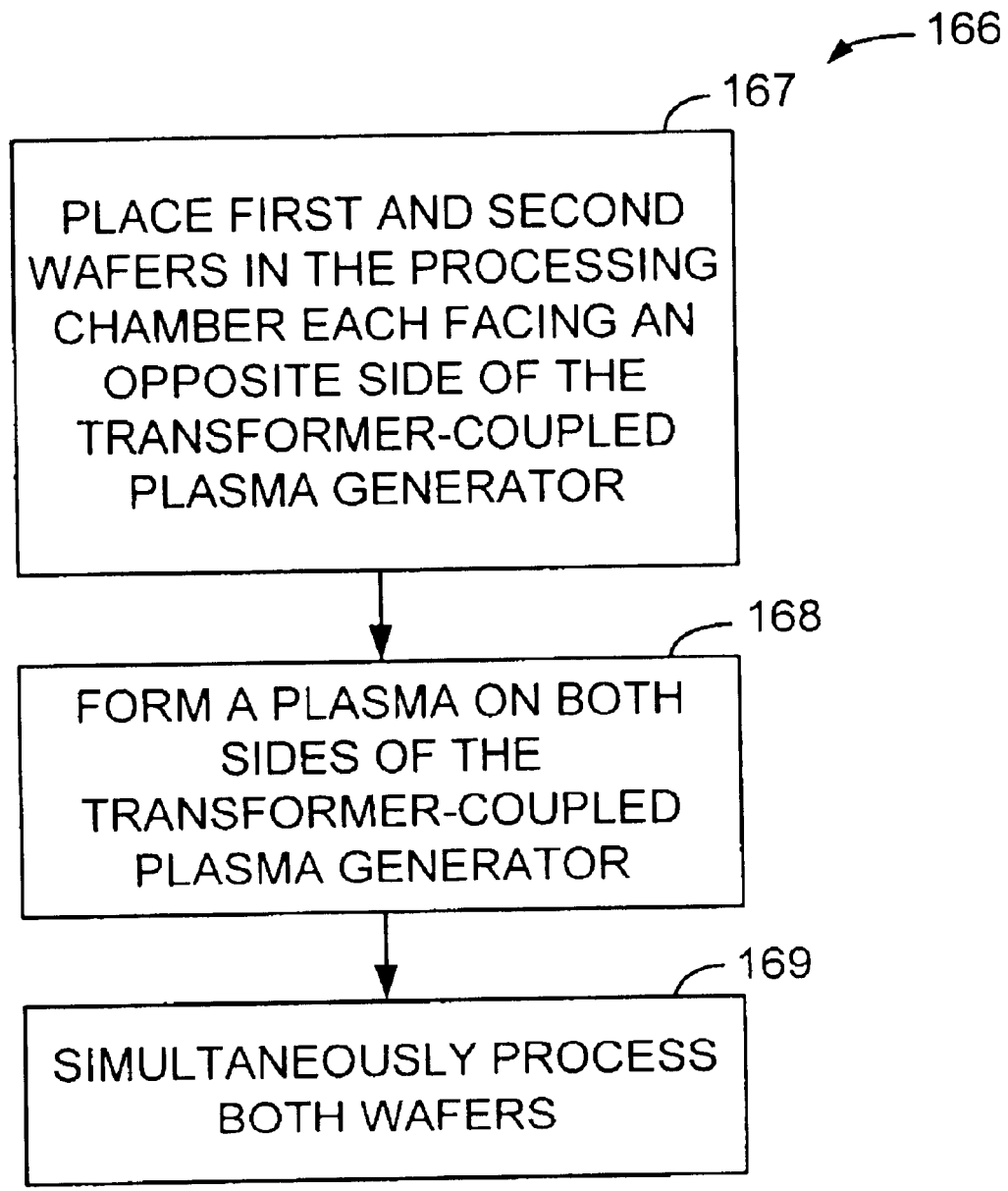
FIG. 2B is a simplified flow chart of a method of multi-wafer plasma processing according to an embodiment of the present invention.

FIG. 2B is a simplified flow chart of a method 166 of simultaneously processing two wafers in processing chamber with a transformer-coupled plasma generator. A first wafer and a second wafer are placed in the process chamber each facing an opposite side of a transformer-coupled plasma generator between the wafers (step 167). A plasma is formed on both sides of the transformer-coupled plasma generator (step 168) to simultaneously process the first and second wafer (step 169). The plasma process could be an etch process, a surface activation process, or a plasma-assisted layer formation process, for example.

V. External Multi-Core Plasma Systems

Figure 3A:
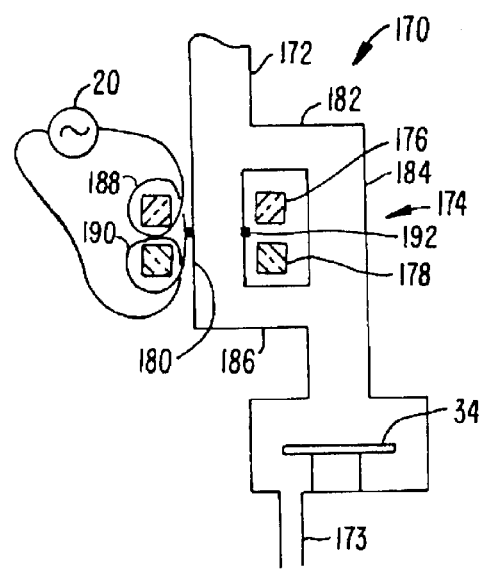
FIG. 3A is a simplified diagram of a plasma processing system with a multi-core plasma generator according to another embodiment of the present invention.

FIG. 3A is a simplified diagram of a plasma processing system 170 with a multi-core plasma generator according to another embodiment of the present invention. A gas inlet conduit 172 provides precursor gas to the plasma generator 174. A chamber exhaust 173 removes Two cores 176, 178, surround a conduit 180 of the plasma generator 174. Additional conduits 182, 184, 186 complete a path around the cores for the plasma to form a secondary circuit of the transformer-coupled plasma generator. The conduits can be made of an electric insulator, such as fused silica or ceramic, or can be made from a metal, such as aluminum or anodized aluminum if a non-conductive gap or spacer is provided in the electric circuit around the core through the conduit walls. Primary coils 188, 190 around the vertically stacked cores 176, 178, are connected to an AC power supply 20. The primary coils are shown as being wound in-phase, that is, current flowing through each primary coil induces plasma flow around each core in the same direction. Alternatively, the primary coils could be wound out-of-phase to each other. While the cores are shown as being relatively close together, they may be separated. An insulator 192 breaks the electric circuit path around the coils if the conduits are made of a conductor. The insulator can be omitted if the conduits or one segment of the conduit path around the core(s) is made of an insulative material.

Figure 3B:
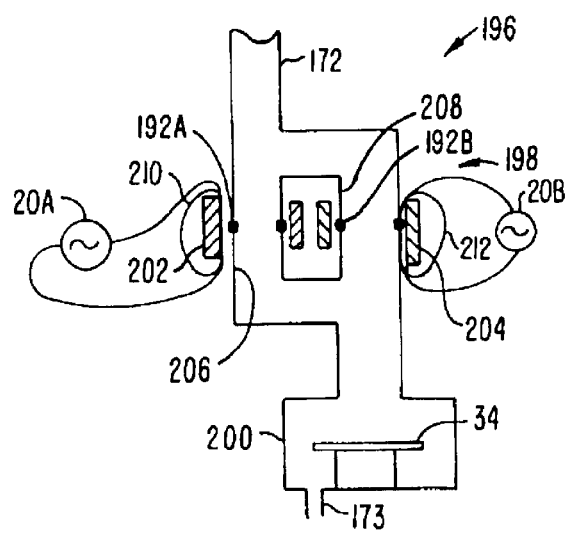
FIG. 3B is a simplified schematic representation of a plasma processing system with a multi-core plasma generator according to another embodiment of the present invention.

FIG. 3B is a simplified schematic representation of a plasma processing system 196 with a multi-core plasma generator 198 according to another embodiment of the present invention. A gas inlet 172 and chamber exhaust 173 provide gas or vapor to the plasma generator 198 and the process chamber 200. A substrate 34 is in the process chamber. It is understood that various types of exhaust and gas delivery systems could be used, and that the representation of the substrate is merely exemplary. Two cores 202, 204 are side-by-side. A separate conduit 206, 208 goes through each core. Each core has a separate AC power supply 20A, 20B driving the primary coils 210, 212; however, a single power supply may be used. Using two separate power supplies allows the phase of each transformer to be individually adjusted by adjusting the power supply. Other adjustments, such as lead length or tuning circuits, can also be used to adjust the phase of the transformers. Insulative spacers 192A, 192B break the electric path through the conduits around the cores if the conduits are made of metal.

Figure 3C:
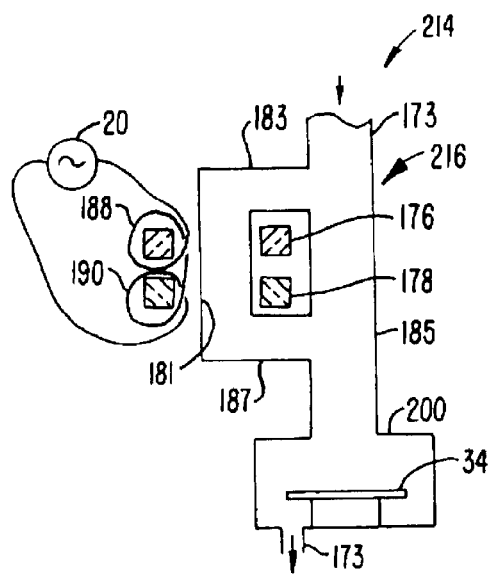
FIG. 3C is a simplified schematic representation of a plasma processing system with a multi-core plasma generator according to yet another embodiment of the present invention.

FIG. 3C is a simplified schematic representation of a plasma processing system 214 with a multi-core plasma generator 216 according to another embodiment of the present invention. A gas inlet 173 provides plasma precursor into the conduits 181, 183, 185, and 187 and a chamber exhaust 173 removes products from the reaction chamber 200. The plasma formed in the plasma generator 216 can be used to process a substrate 34, as in a layer formation or etch process, or can be used for chamber cleaning, device cleaning, surface treating, or sterilization processes, among others. The AC power supply 20 provides electric current to the primary coils 188, 190, which couple to the cores 176, 178.

Figure 3D:
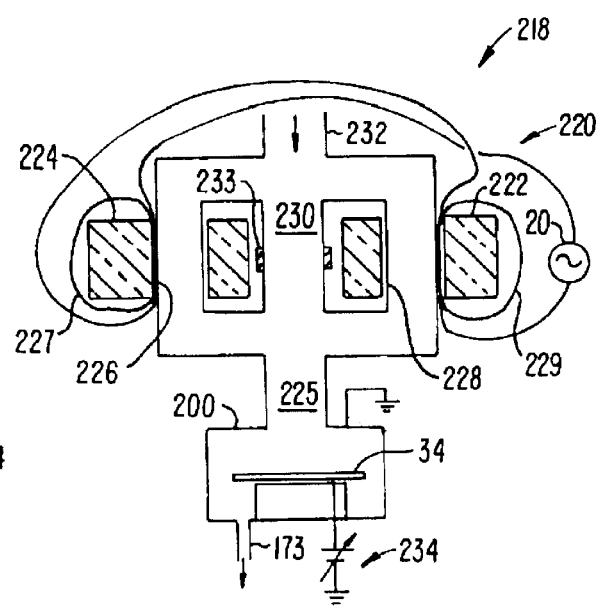
FIG. 3D is a simplified schematic representation of a plasma processing system with a multi-core plasma generator according to another embodiment of the present invention.

FIG. 3D is a simplified schematic representation of a plasma processing system 218 with a multi-core transformer plasma generator 220 according to another embodiment of the present invention. The plasma generator has two cores 222, 224 with conduits 226, 228 traversing through the center of the cores, and a bypass conduit 230 extending from the gas inlet 232 to an outlet 225 providing plasma to the process chamber 200. The AC power supply 20 drives the primary coils 227, 229 in series, but the primary coils could driven in parallel in other embodiments. A dielectric spacer 233 in the bypass conduit provide a gap in the eddy current path through the conduits around both coils. A bias supply 234 provides an electric potential between the substrate 34 and the conductive portions of the chamber forming a circuit through the plasma and typically through a common ground. The bias supply can be a direct-current supply, as shown, or can be another AC supply. The bias supply can assist in the transport of ions in the plasma to the surface of the substrate, as with a DC bias supply, or can provide motion back and forth along a selected direction, i.e. perpendicular to the surface of the substrate, with an AC supply. Either type of bias supply may be added to the systems shown in FIGS. 3A, 3B, and 3C, above. Similarly, additional cores and associated components could be added to the embodiments shown to produce additional multi-core transformer plasma generators.

Figure 3E:
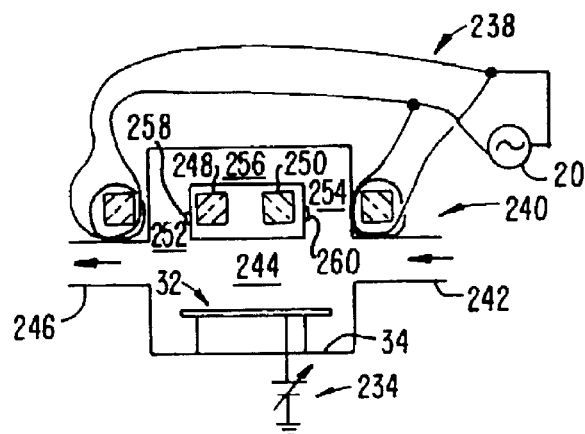
FIG. 3E is a simplified schematic representation of a plasma processing system with a multi-core plasma generator according to yet another embodiment of the present invention.

FIG. 3E is a simplified schematic representation of a plasma processing system 238 with a multi-core transformer plasma generator 240 according to another embodiment of the present invention. In this embodiment, the gas inlet 242 provides plasma precursor(s) and other gases or vapors to the process chamber 244. The chamber exhaust 246 creates a flow from the inlet 242 across the surface 32 of the wafer 34. The transformer cores 248, 250 of the plasma generator 240 have conduits 252, 254 passing through the centers of the toroidal cores. A linking conduit 256 and the process chamber 244 complete the secondary circuit of the transformer. Dielectric spacers 258, 260 break the eddy current path around the conduit walls, which are made of anodized aluminum.

Figure 3F:
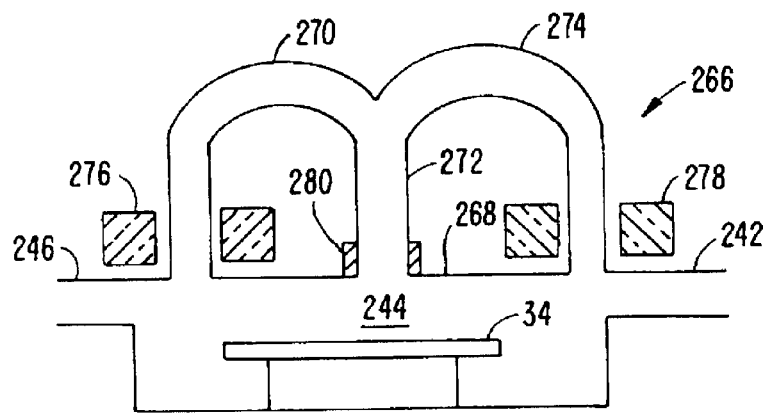
FIG. 3F is a simplified schematic representation of a multi-core plasma processing system with a planar array of exterior transformer cores.

FIG. 3F is a simplified diagram of a plasma processing system 262 with a multi-core plasma generator 264 according to another embodiment of the present invention. A chamber lid 266 is made from a plate 268 and tubes 270, 272, 274. The lid can be made from stainless steel or aluminum alloy, for example. Toroidal transformer cores 276, 278 surround the outer tubes 270, 274, typically resting on the plate 268 with an intervening spacer (not shown). In one embodiment, the outer tubes are approximately 25.4 mm (1 inch) in diameter. A dielectric spacer 280 in the center tube 272 breaks the eddy current path around the cores. As in FIG. 3E, above, the gas inlet 242 and chamber exhaust 246 create a flow across the surface of the substrate 34. Alternatively, the gas or vapor could be admitted into the processing chamber 244 from vents in the chamber lid, or vents around the perimeter of the processing chamber. Similarly, the exhaust could draw from beneath the substrate, or from the perimeter of the substrate.

Figure 3G:
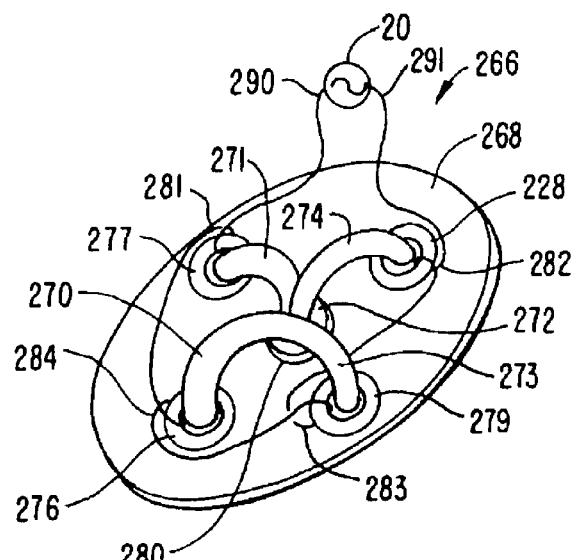
FIG. 3G is a simplified perspective view of an example of a top plate of a multi-core plasma system as could be used in the system illustrated in FIG. 3F.

FIG. 3G is a simplified perspective view from the top of the lid 266 illustrated in FIG. 3F. Two additional tubes 271, 273 join the two tubes 270, 274 shown in FIG. 3F at the center tube 272. There are also toroidal transformer cores 275, 279 around the base of these tubes 271, 273. Leads 290, 291 from an AC power supply 20 are connected to the primary coils 281, 282, 283, 284 around the toroidal transformer cores 276, 277, 278, 279 in series, but could be connected in parallel or series-parallel. Similarly, different power supplies could be used to drive the various transformer circuits.

VI. Multi-Core Plasma Generators

Figure 4A:
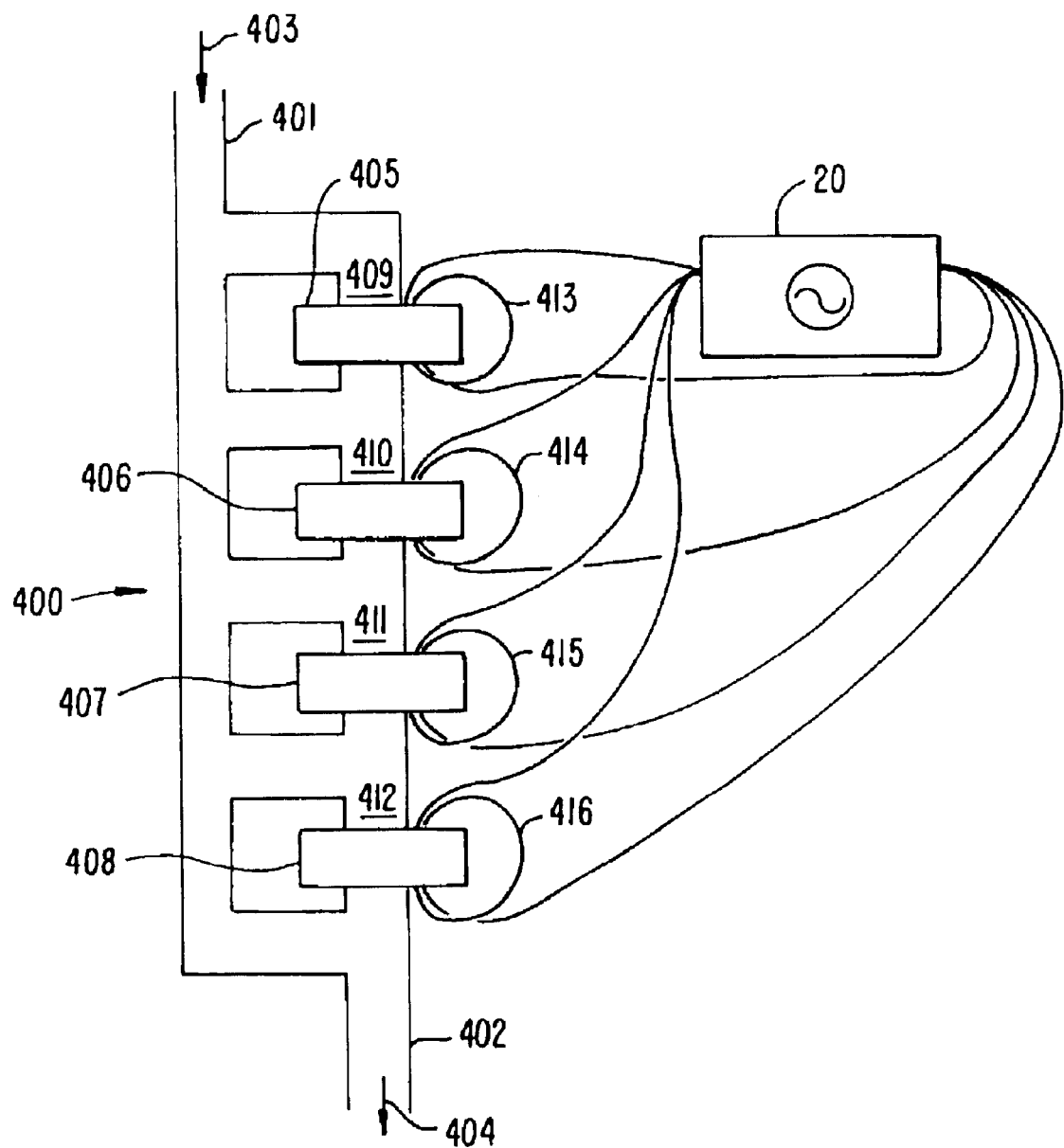
FIG. 4A is a simplified diagram of a multi-core plasma generator according to an embodiment of the present invention.

FIG. 4A is a simplified diagram of a multi-core plasma generator 400 according to another embodiment of the present invention. A gas inlet 401 provides gas and/or vapor from a gas delivery system (not shown), and plasma flows out the outlet 402. It is understood that gas or vapor can also flow out the outlet, and that additional inlets could be provided. For example, it may be desirable to provide an additional inlet near the outlet to provide a dilutent gas to reduce plasma recombination or to increase the flow though the outlet without increasing the flow through the plasma generation zones.

Toroidal transformer cores 405, 406, 407, 408 surround conduits 409, 410, 411, 412 that carry gas or vapor through the center of the tori to be disassociated (or at least partially disassociated) into plasma. An AC power supply 20 provides current to the primary coils 413, 414, 415, 416. In this example the primary circuits are driven in parallel; however, in another example they can be connected in series. Similarly, in another embodiment the cores can alternate sides of the plasma generator, or additional cores and associated circuitry can be added to surround other conduit segments.

Figure 4B:
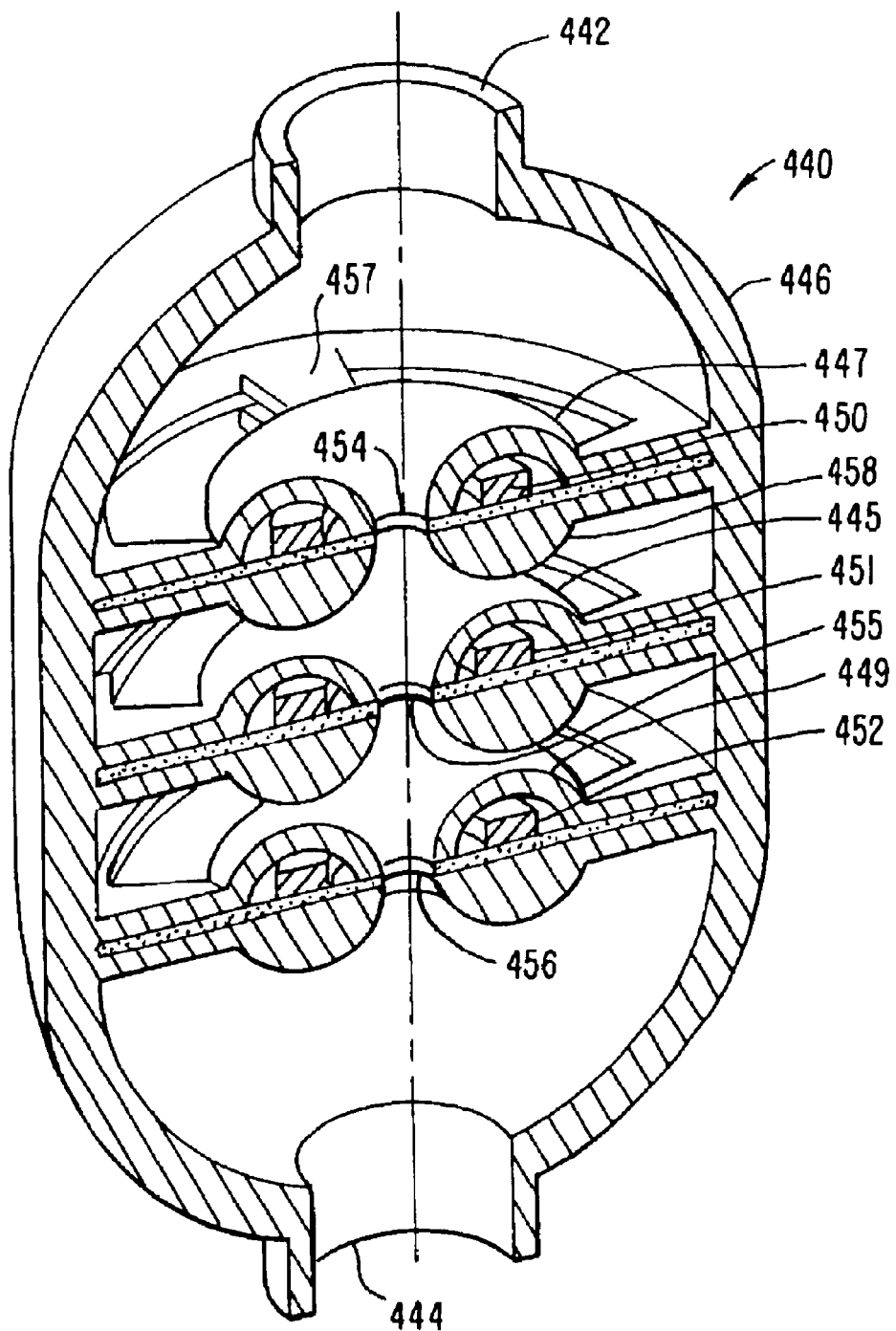
FIG. 4B is a simplified sectioned perspective view of a multi-core plasma generator according to another embodiment of the present invention.

FIG. 4B is a simplified sectioned perspective view of a multi-core transformer coupled plasma generator 440. The generator has an inlet 442 for admitting plasma precursor(s) and an outlet 444 that provides plasma to a plasma process, such as a deposition chamber cleaning process. These designations are used solely for purposes of illustration and the actual flow may be reversed in some applications. The generator has an outer shell 446 surrounding each toroidal plasma generator stage and inner shells 447, 448, 449 surrounding the toroidal transformer cores 450, 451, 452. The shells can be made of metal if a non-conductive gap or dielectric spacer 454, 455, 456 is included to prevent eddy currents. The dielectric spacer can be located in different locations around the core. Webs 457 support the generator stages inside the outer shell 446 of the plasma generator, while allowing gas and plasma to flow around each core.

A primary coil (not shown) around each core couples electromagnetic energy to the plasma generator. The electrical leads (not shown) are typically lead out from the cores to outside the outer shell through the webs. A bottom portion 458 of the inner shell 447 is shaped to promote a symmetrical flow of plasma around the inner shell. When AC current is provided to the plasma generator under plasma-generating conditions, plasma flows back and forth through the centers of each toroidal plasma generating stage (i.e. each core, primary coil, and inner shell). The toroidal configuration of each stage produces a plasma density distribution that is greater in the center of the generator and generally extends beyond the inner shells. In other words, the toroidal plasma generator produces a plasma with directionality, specifically, with a high plasma concentration extending along the center axis of the cores. This directionality can be a desired attribute in some applications, such as a source for ion implantation or ion milling, or a plasma torch application.

VII. Spatial Plasma Density

Figure 5A:
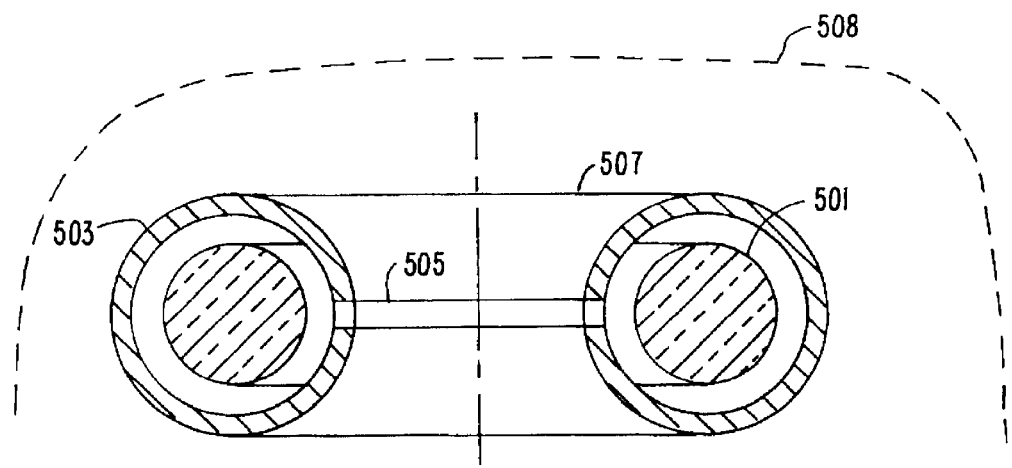
FIG. 5A is a simplified cross section of a toroidal transformer-coupled plasma generator.
Figure 5B:
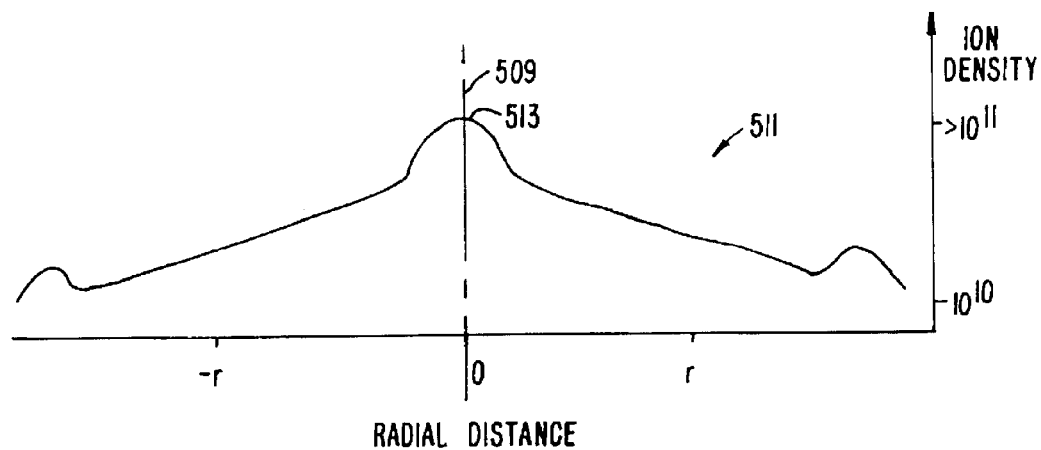
FIG. 5B is a simplified graph of ion density versus radial distance for the toroidal transformer-coupled plasma generator illustrated in FIG. 5A.

FIG. 5A is a simplified cross-section of a toroidal core 501 inside a shroud or cover 503 with a dielectric gap 505. An upper edge 507 of the cover forms a reference plane. A portion of the chamber wall is shown as dotted line 508. FIG. 5B is a simplified cross-section of a representative ion density distribution 511 along the radial distance from the center axis 509 of the torus in the reference plane. Alternatively, a constant ion density could be shown versus distance from the reference plane. Such a curve would have a similar shape. The ion density has a maximum 513 along the center axis of the torus, that is, ions are essentially ejected outside of the torus along the center axis. It is believed this ion distribution arises due to crowding of the plasma within the inner circumference of the toroidal cover. The ion density is bilaterally symmetrical about the plane of intersection with the circumference of the torus, and has theta symmetry about the center axis. The ion density also generally represents the temperature of the plasma, so the temperature at the center axis is hotter than elsewhere at a similar distance from the reference plane.

The absolute ion density depends on many factors, such as the dimensions of the transformer structure, including the inner diameter of the cover and radius of the core, the pressure, the plasma species, and the AC drive frequency. However, it is possible to drive the transformer at a sufficiently high frequency to establish an essentially steady-state ion distribution as shown. Thus, the transformer-coupled plasma generator can maintain an enhanced ion density or temperature above the reference plane formed by the upper edge of the cover. If a more uniform plasma is desired, the inner diameter of the transformer structure can be increased relative to the diameter of the core. Additional plasma shaping can be done with shaped cores or core covers, or by using electromagnetic fields.

VIII. Ion Implantation Source

Figure 6A:
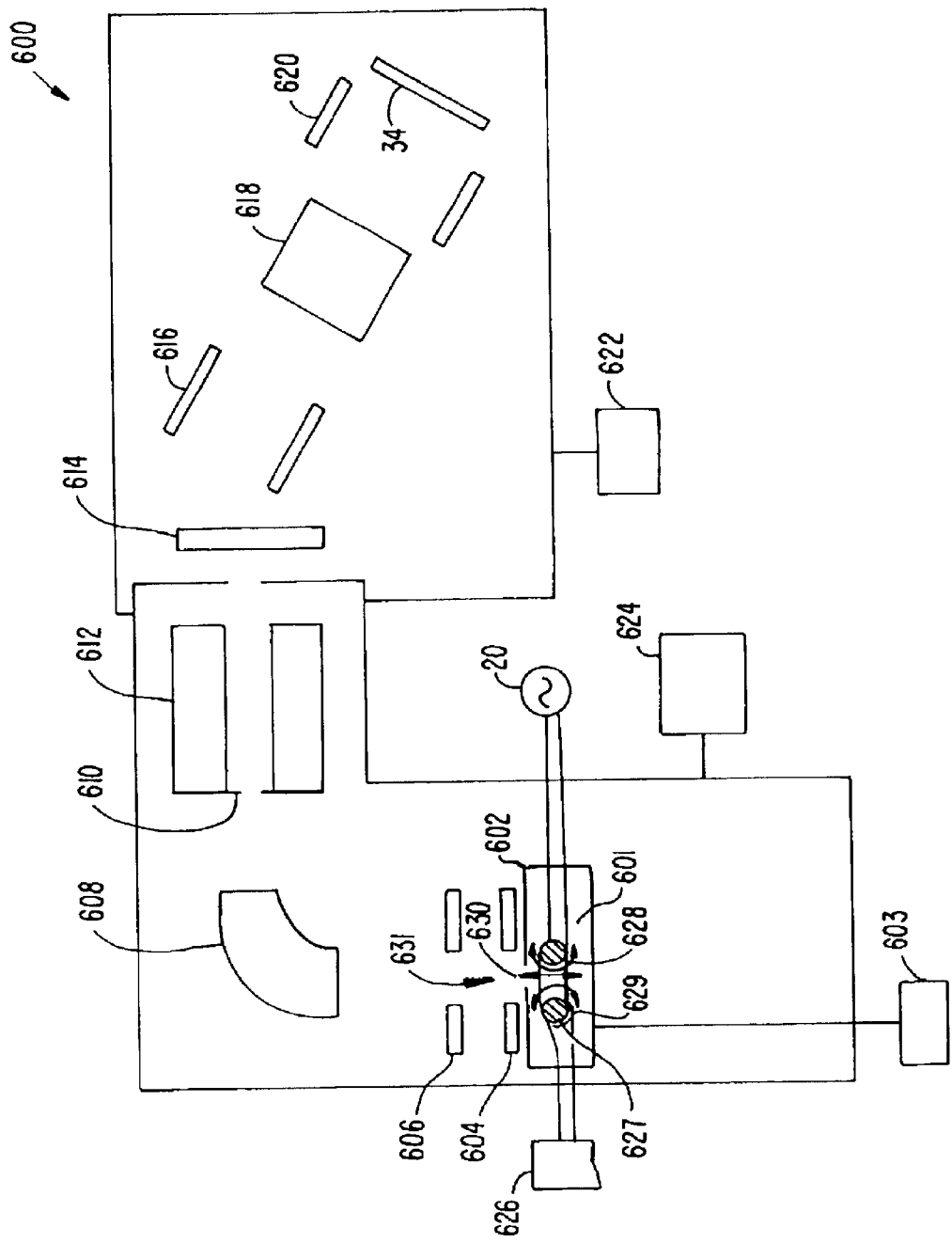
FIG. 6A is a simplified diagram of an ion implantation system with a toroidal plasma source according to an embodiment of the present invention.

FIG. 6A is a simplified diagram of an ion implantation system 600 according to another embodiment of the present invention. The system includes a transformer-coupled ion source 602, which is driven by an AC power supply 20. A gas delivery system 603 provides the precursor gas or vapor to the ion source 602.

In a conventional ion implantation system, a hot filament or arc discharge is typically used to ionize a gas into ions for implantation. For example, the gas may provide boron or arsenic ions for P-type or N-type doping of a silicon wafer. The ions are extracted from the ion source with extraction electrodes 604, 606 and slightly accelerated so that an analyzing magnet 608 can select the desired ions according to their mass and charge in conjunction with a resolving aperture 610. The extraction electrodes are generally at different electric potentials and form an electric field gradient to accelerate ions of the proper polarity. The selected ions are then accelerated in an acceleration tube 612 to a selected energy for implantation into the substrate or wafer 34, also referred to as the target. A focusing element 614, neutral beam trap 616, Y-axis scanner 618, and X-axis scanner 620 are a few of the other elements typically present in an ion implantation system. Additional elements, such as high-voltage power supplies, controllers, additional extraction electrodes and beam traps (mass resolving slits) may also be present but are not shown for simplicity of illustration. In some systems, the extraction electrodes 604, 606 are an integral part of the ion source 602. A number of vacuum pumps 622, 624, 626 can be operated to provide a selected and differential vacuums in various portions of the system.

The transformer-coupled ion source 602 includes a toroidal core 627 and a primary coil 629 and produces a poloidal current flow around the core 627 of the transformer, represented by the double-ended arrows 628, 630. For purposes of discussion, the primary coil, transformer core, and secondary plasma circuit will be referred to as the transformer coupled toroidal plasma generator. Additional components, such as a cover for the core, mounting structure to hold the generator in the ion source, and a cooling system are not shown for clarity of illustration. In other embodiments, the ion source can be a multicore plasma generator such as that shown in FIG. 4A or 4B.

The plasma has theta symmetry, that is, the plasma density profile is generally symmetrical about the center axis of the toroidal core. However, the plasma density varies along a radial direction from the center axis of the toroidal core. In particular, the plasma is concentrated through the center of the core, as shown in FIG. 5B above.

It is believed that the directionality of the plasma density distribution along the center axis of the torus, represented by the double-ended arrow 630, aids in the extraction of ions from the ion source through the opening or aperture in the ion source. The aperture in the ion source is aligned with the center axis of the torus such that the center concentration of ions (ref. FIG. 5B, num. 513) is "pushed" out of the ion source. In other words, the transformer-coupled toroidal ion source ejects ions out of the source toward the extraction electrodes, rather than relying on diffusion (drift) and extraction field intrusion into the ion source chamber 601 to remove ions form implantation out of the ion source chamber.

Providing this initial transport of plasma from the transformer core allows greater extraction of ions over a wider range of extraction voltages. The extraction voltage typically affects the boundary shape of the ions exiting the ion source; however, the extraction voltage that achieves the optimal source ion boundary shape is not necessarily the optimum extraction voltage for maximum ion flux. This can result in longer implantation times and reduced throughput.

It is believed that a toroidal transformer-coupled ion generator will produce a higher ion flux than conventional sources for similar operating conditions. A high ion flux may also allow greater control of the beam shape and provide more accurate implantation. In particular, a high initial ion flux out of the ion source may allow a high-dose, relatively low energy (shallow) implantation with low noise and divergence because more ions are present in the initial beam than are needed and only a portion of the ion beam (e.g. the center portion) might be selected for acceleration.

Figure 6B:
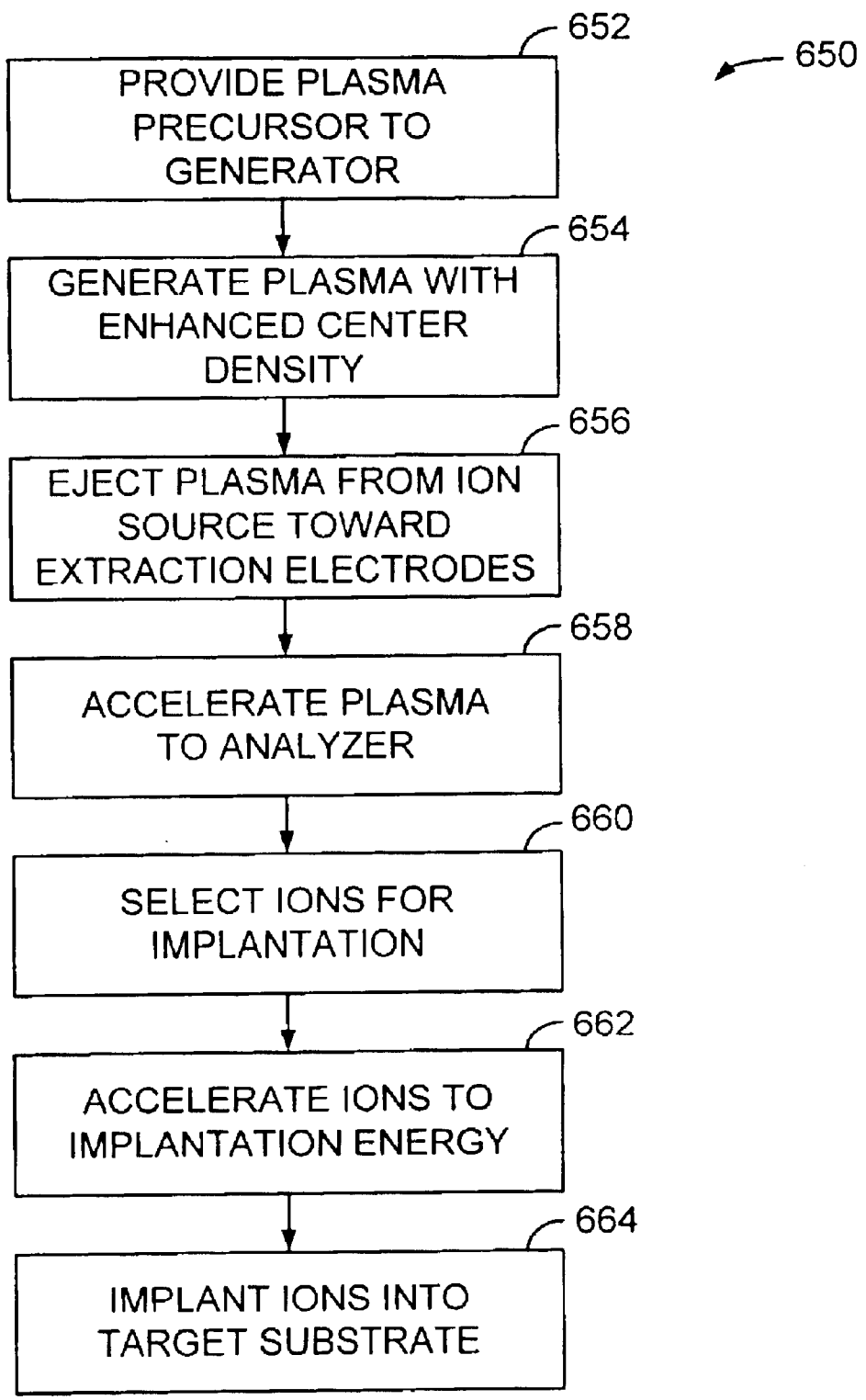
FIG. 6B is a simplified flow chart of an ion implantation process according to an embodiment of the present invention.

FIG. 6B is a simplified flow chart of an ion implantation process 650 according to an embodiment of the present invention. An ion precursor is provided to transformer-coupled toroidal plasma generator (step 652). The transformer-coupled toroidal plasma generator ionizes the ion precursor to form a plasma with a plasma density distribution varying along a radial direction from a center axis of the toroidal core, the plasma density being greater near the center axis (step 654). Ejecting a portion of the plasma along the center axis toward an electric field gradient formed by extraction electrodes (step 656), accelerating the plasma toward a mass/charge analyzer (step 658) to select a portion of the ions for implantation (step 660), accelerating the portion of selected ions to a selected implantation energy (step 662) and implanting the selected ions into the surface of a target (step 664).

IX. Plasma Torch Head

Figure 7A:
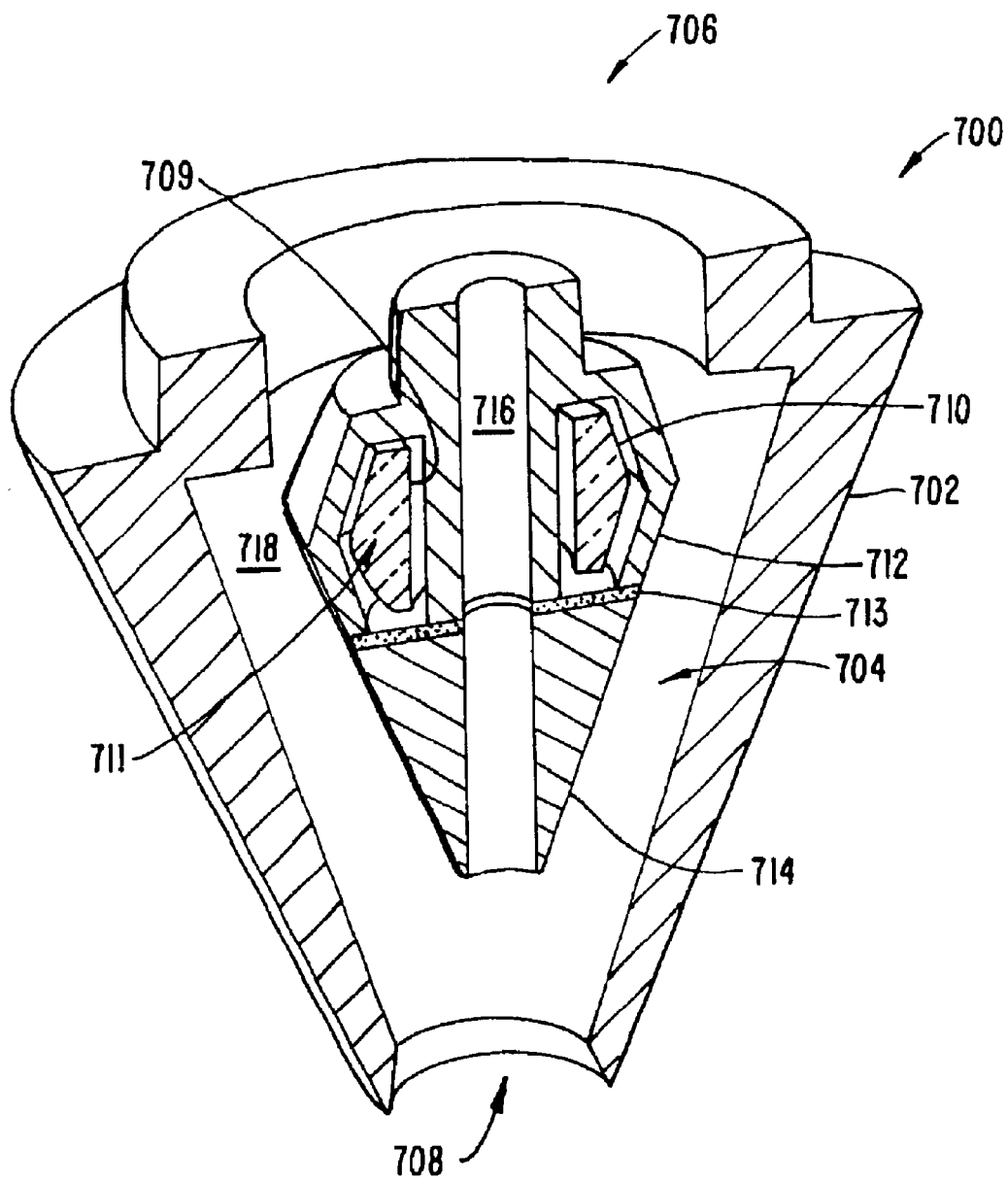
FIG. 7A is a simplified sectioned perspective view of a portion of a plasma torch head according to an embodiment of the present invention.

FIG. 7A is a simplified sectioned perspective view of a plasma torch head 700 according to another embodiment of the present invention. The plasma torch head might be used in any of several applications, such as cutting shapes from material stock or in a die-separation process. For example, it may be desirable to use a plasma torch instead of a saw when separation micro-electro-mechanical systems ("MEMS") dice to reduce particle generation that can degrade performance of the MEMS dice.

The torch head 700 includes an outer nozzle 702 and an inner nozzle 704. Gas from which the plasma is formed enters from the inlet side 706 of the torch head and plasma and gas exit the outlet 708. The inner nozzle 704 includes a toroidal core 710 of a transformer-coupled plasma generator. A primary coil (not shown) couples electro-magnetic energy from an AC power supply (not shown). Additional cores and primary coils may be stacked along the center axis of the conduit to promote the directionality of the plasma. In this embodiment, the core has an essentially semicircular cross-section 711 with a long edge 709 parallel to the conduit. The leads (not shown) for the primary coil can be lead through a web, as is described according to reference numeral 457 in FIG. 4B, above. The inner nozzle also includes an upper shell 712, a dielectric spacer 713, and a lower shaped portion 714. A conduit 716 extends through the inner nozzle. The upper shell and the lower shaped portion are made of a suitable metal or alloy, such as an aluminum alloy.

Generally speaking, a high-density plasma is formed in the conduit 716 in the portion of the conduit proximate to the core 710, with the plasma current return path through a bypass 718. A plasma initiator device, such as an electric arc or high-frequency parallel plate initiator may be used in some applications to assist in the initial formation of a plasma. Once the plasma is initiated, the toroidal transformer-coupled plasma generator can maintain the plasma over a wide range of operating conditions, such as pressure (e.g., 1 mTorr to 100 Torr) and flow rate The bypass 718 allows for a separate gas flow that does not flow through the conduit 716. This gas flow can serve many purposes. It can provide cooling to the inner nozzle, mass transport of the plasma out the outlet 708, and can dilute the plasma to reduce recombination. In one embodiment, a separate gas, e.g. propane or hydrogen, is flown through the bypass while another gas, e.g. oxygen, is flown through the conduit. In another embodiment, the same gas is flown through the conduit and the bypass. Some plasma is in the bypass, as well as in the conduit, to complete the secondary circuit around the transformer core. The tapered shape of the outer nozzle provides an increase in velocity and concentration of the plasma and carrier gas exiting the outlet 708. The poloidal flow of plasma around the core 710 provides a high-density plasma extending along the center axis of the nozzle. This directional aspect to the plasma operates in conjunction with the gas flow to efficiently provide plasma at the outlet 708 of the torch head 700, which lies on the centerline with the conduit.

Using a toroidal transformer-coupled plasma generator within the torch head has several advantages over conventional arc-type plasma torch heads. First, arc-type plasma generators are typically run at several hundred volts, which can be lethal if an operator comes in contact with the voltage. While the arc electrodes are typically unavailable to the operator during use, exposed powered electrodes or failures in the isolation of high voltages may present a lethal electrical shock hazard. In comparison, the electrical components of the toroidal transformer-coupled plasma generator can be completely enclosed, and remain so even during servicing of the torch head.

Second, the AC power supply can be a simple step-up/step down transformer and in some applications might run at the frequency of the line supply (e.g. 60 Hz).

Third, conventional arc-type electrodes are exposed to the plasma and plasma precursor, often causing electrode erosion or contamination. The erosion of the electrodes is exacerbated by the fact that the greatest erosion typically occurs at the point of the electrode, where it is generally desirable to generate the high voltage gradients desired for arc discharge. The toroidal transformer-coupled plasma generator has cover with a relatively high surface area surrounding the core, thus intense field lines intersecting the surface of the cover are substantially avoided. Similarly, the poloidal plasma flux generated by the toroidal core runs essentially parallel to the surface of the cover, thus sputtering or similar damage to the core is substantially eliminated.

Fourth, while arc discharge generators are relatively sensitive to pressure and flows, and may become unstable or extinguish if appropriately stable operating conditions are not established, the transformer-coupled plasma generator can operate over a wide range of pressures and flow rates.

Figure 7B:
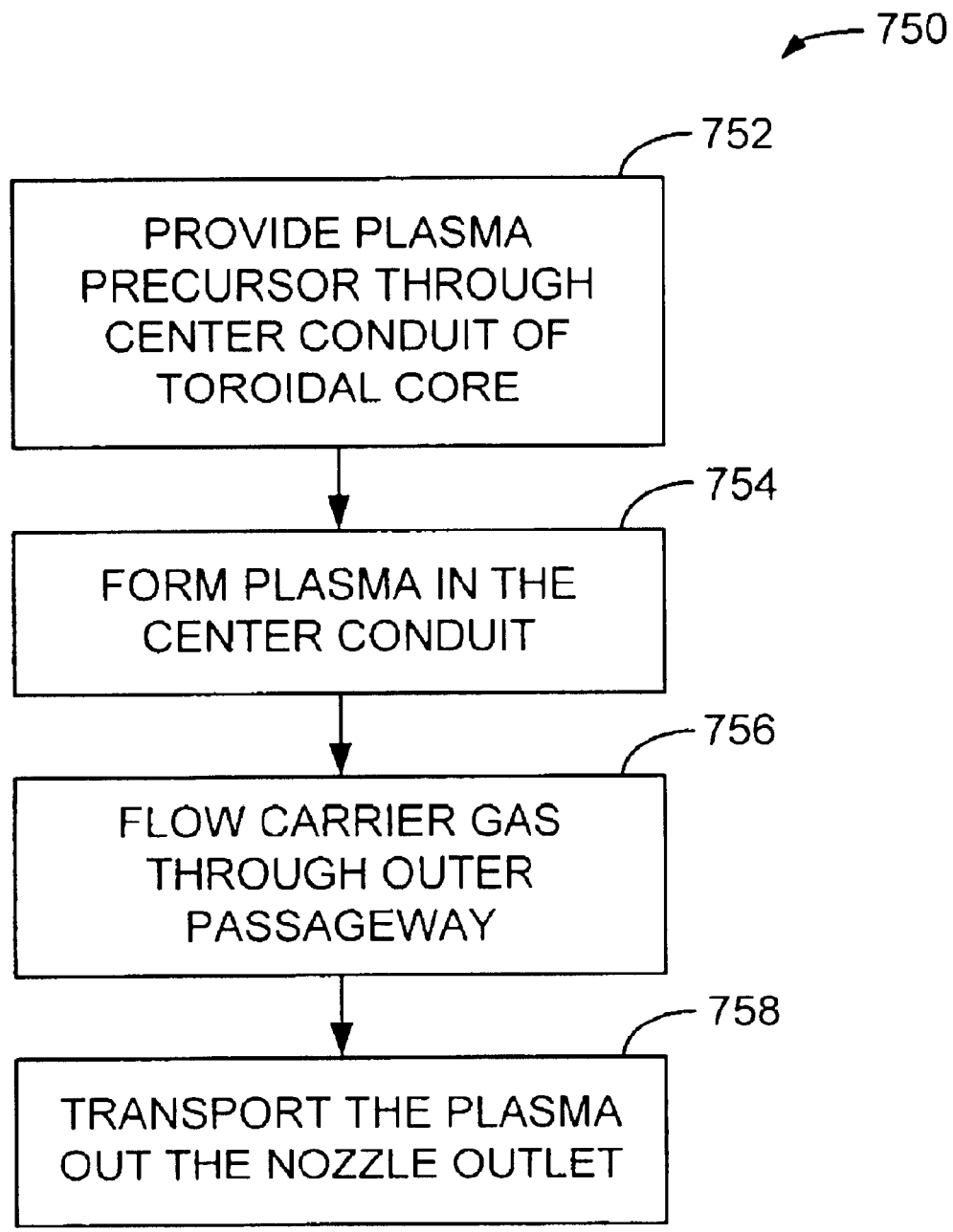
FIG. 7B is a simplified flow chart of a plasma cutting method according to an embodiment of the present invention.

FIG. 7B is a simplified flow chart of a plasma torch cutting process 750 according to an embodiment of the present invention. A plasma precursor is flown from an inlet end toward an outlet end of a plasma torch head through a conduit passing through a center of an inner nozzle (step 752). The inner nozzle includes a toroidal plasma generator that ionizes the precursor to form a plasma (step 754) in the center conduit. A carrier gas is flown through an outer passageway formed between the outer surface of the inner nozzle and an inner surface of an outer nozzle (step 756) to cool the inner nozzle and to assist in the transport of plasma formed in the inner nozzle out the outlet (step 758). The order given is merely exemplary, and the steps can be performed in other orders, such as initiating carrier gas flow before or concurrently with the flow of the plasma precursor.

X. Ion Milling Source

Figure 8A:
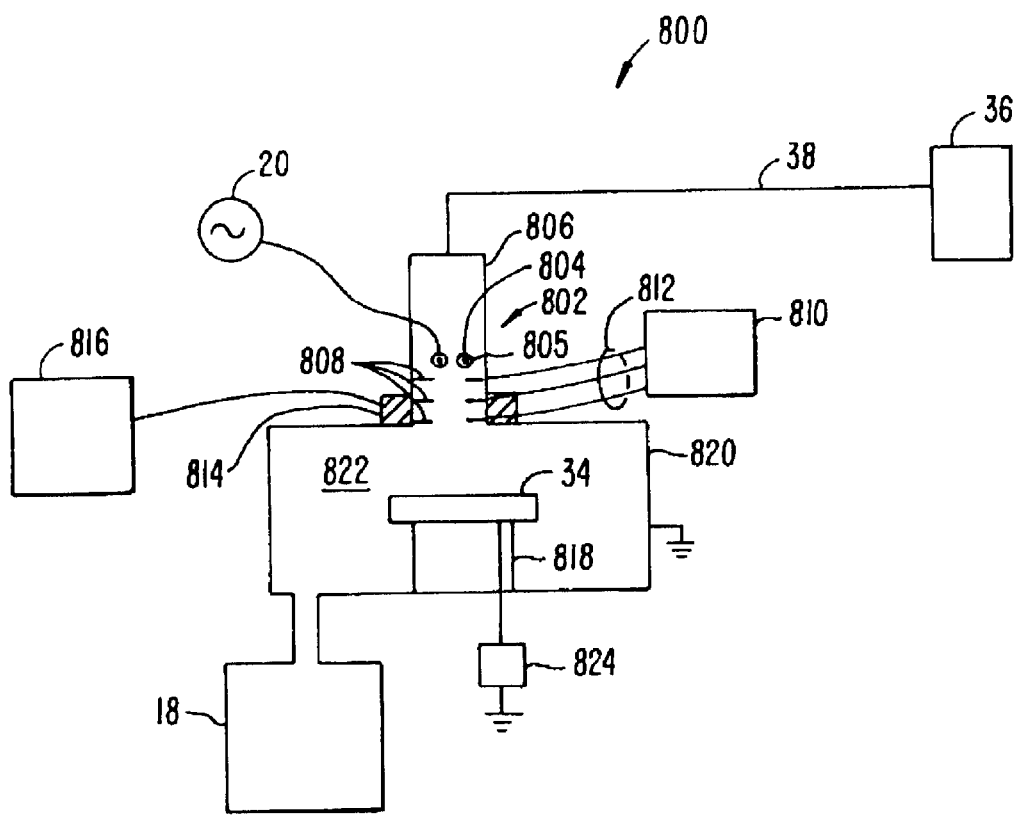
FIG. 8A is a simplified diagram of an ion milling system with a toroidal plasma source according to an embodiment of the present invention.

FIG. 8A is a simplified diagram of an ion milling system 800 with an ion source 802 according to an embodiment of the present invention. A toroidal transformer core 804 is contained within the ion source 806 and is driven by an AC power supply 20. A primary coil (not shown) couples electromagnetic energy from the AC power supply to the transformer core. The transformer core 804 is typically housed in a shell 805 supported by a web, as shown in FIG. 4B, above, and includes a dielectric gap in the shell and typically a shaped portion (both not shown) to direct the plasma (ions) generated by the transformer-coupled plasma generator. Additional cores may be stacked along the center axis, as discussed in reference to FIG. 4B, above.

Accelerator plates or grids (also called vanes) 808 connected to a high-voltage power supply 810 via power lines 812 accelerate ions generated proximate to the transformer core 804, particularly those generated along the center axis of the toroidal core, toward the target substrate 34 in response to a voltage gradient established between the plates. The high-voltage power supply is typically a direct-current supply operating at between about 300–1,500 Volts.

A focusing magnet 814 powered directed by a controller 816 with a power supply operates as a lens to produce an ion beam of a selected diameter at a selected location on the substrate 34. The substrate is held by a chuck 818, such as a vacuum or electrostatic chuck. In one embodiment, an electrostatic chuck with grooves for circulating a coolant against the backside of the substrate is used. Helium gas is circulated in the grooves to thermally couple the substrate to the chuck, which is cooled with a water-based coolant. A vacuum system provides the desired chamber pressure, typically between about 10–80 mTorr, in conjunction with gases supplied from the gas delivery system 36 through the gas conduit(s) 38.

Gas supplied to the ion source 806 can be substantially inert, such as argon or krypton, or can be reactive, such as $O_2$, $C_2F_5H$, $F_2$, $NF_3$, $CF_4$, $C_3F_8$, or $SF_6$. In the first case, ion milling is achieved primarily through physical sputtering, while in the latter cases the ion milling may occur through both physical and reactive ion sputtering, depending partially on the type of material being removed. In either case, the ion milling system provides a directed beam of ions to the surface of the substrate for selective removal of material. While the beam is generally directed with the focusing magnet, in one embodiment the substrate 34 and chuck 818 can be tilted and rotated with respect to the ion source 806. To avoid charge build-up on the surface of the substrate, in some embodiments a secondary plasma is formed between the surface of the plasma and the wall 820 of the processing chamber 822 using a secondary plasma supply (AC or DC) 824. This secondary plasma over the wafer surface assists in dissipating the accumulated charge to the grounded chamber wall 820, which is typically made of aluminum or aluminum alloy.

Figure 8B:
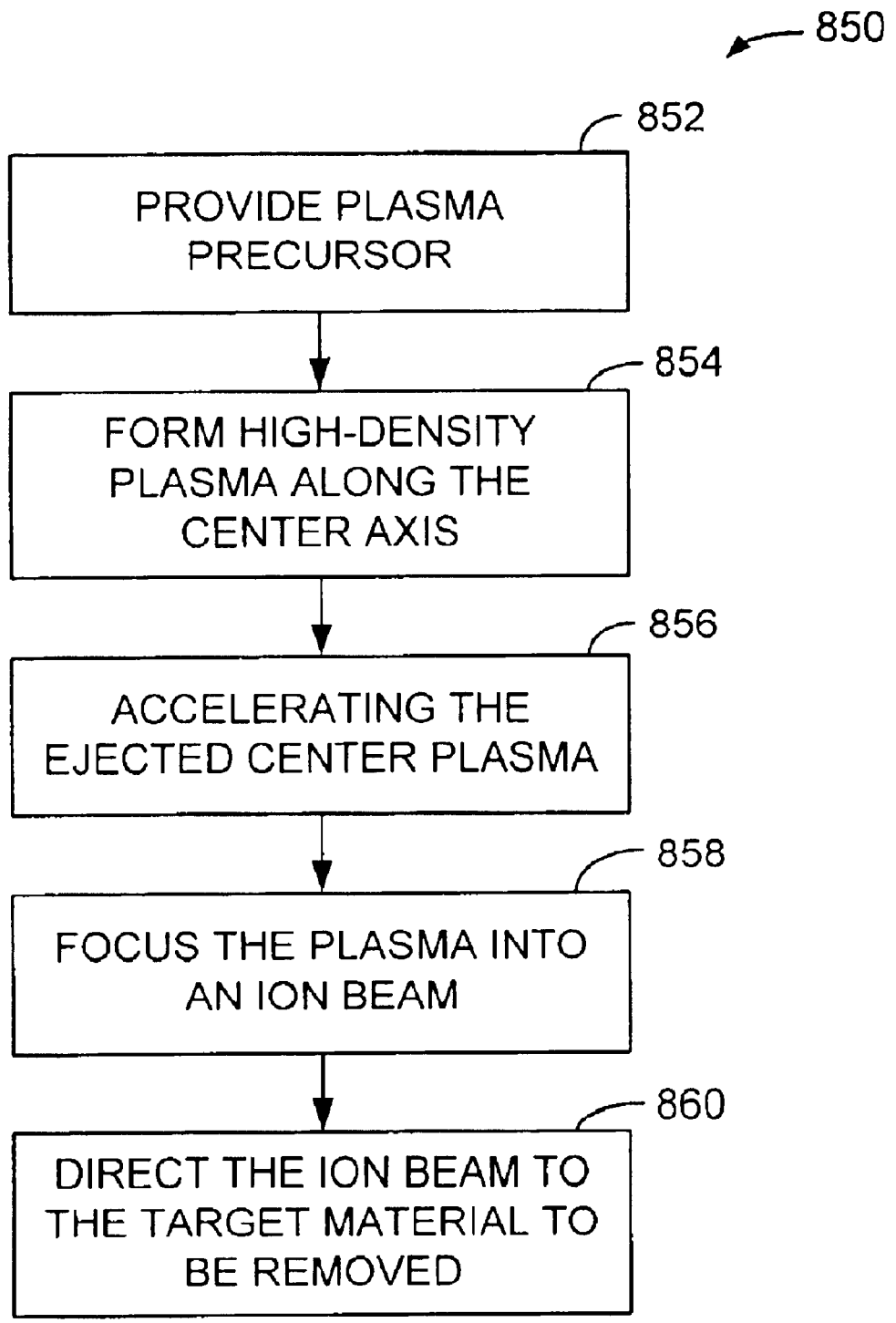
FIG. 8B is a simplified flow chart of an ion milling process according to an embodiment of the present invention.

FIG. 8B is a simplified flow chart of an ion milling process 850 according to another embodiment of the present invention. An ion precursor is provided to transformer-coupled toroidal plasma generator (step 852). The transformer-coupled toroidal plasma generator ionizes the ion precursor to form a plasma with a plasma density distribution varying along a radial direction from a center axis of the toroidal core, the plasma density being greater near the center axis and diminishing with increasing radial distance from the center axis (step 854). Accelerating a portion of the plasma from the center axis toward a target with accelerator plates (step 856), focusing the ejected plasma into an ion beam (step 858), and directing the ion beam to a selected portion of a target substrate (step 860) to selectively remove material from the substrate.

While the invention has been described above with respect to specific structures and process steps, it is understood that the invention is not limited to the described embodiments. In particular, alternative configurations of the cover, shape of the core, core materials, or placement of dielectric gaps, or use of other precursors or other process. For example, although embodiments have generally been illustrated with an essentially round core, the core could be made of straight segments, such as in the shape of a square, rectangle, hexagon, or octagon, among others. Similarly, although embodiments have generally been illustrated with one or two substrates, additional substrates could be processes, such as by placing several substrates on the substrate support member(s). These equivalents and alternatives are intended to be included within the scope of the present invention. Other variations will be apparent to persons of skill in the art. Accordingly, it is not intended to limit the invention except as provided in the appended claims.

What is claimed is:

1. A substrate processing chamber comprising:
   a chamber body;
   a chamber top disposed on the chamber body; and
   a transformer-coupled plasma generator plate within the substrate processing chamber having a plurality of transformer cores within the transformer-coupled plasma generator plate and a plurality of through holes forming conduits from a first side of the transformer-coupled plasma generator plate to a second side of the transformer-coupled plasma generator plate, a first of the conduits passing through a first transformer core and a second of the conduits not passing through a transformer core.

2. The substrate processing chamber of claim 1 wherein the plasma generator plate is flat.

3. The substrate processing chamber of claim 1 wherein a first primary coil is disposed to electro-magnetically couple to the first transformer core and a second primary coil is disposed to electro-magnetically couple to a second transformer core within the transformer-coupled plasma generator plate, wherein the first primary coil and the second primary coil are connected to each other in series.

4. The substrate processing chamber of claim 1 wherein the transformer core comprises ferrite material.

5. The substrate processing chamber of claim 1 wherein the transformer-coupled plasma generator plate includes a dielectric spacer between the first side and the second side, and a remainder of an outer surface of the generator plate comprises an electrical conductor.

6. The substrate processing chamber of claim 5 wherein the dielectric spacer is disposed within a conduit through the transformer-coupled generator plate.

7. The substrate processing chamber of claim 1 further comprising an alternating-current power supply configured to operate at a frequency of about 1 KHz–2 MHz.

8. A substrate processing chamber comprising:
   a chamber body;
   a chamber top disposed on the chamber body;
   an alternating-current power supply; and
   a transformer-coupled plasma generator plate having a plurality of through holes forming conduits from a first side of the transformer-coupled plasma generator plate within the substrate processing chamber to a second side of the transformer-coupled plasma generator plate within the substrate processing chamber, a first portion of the conduits passing through centers of a plurality of toroidal transformer cores within the generator plate and a second portion of the conduits not passing through centers of transformer cores, the generator having a first surface comprising metal, a second surface comprising metal, and a plurality of dielectric spacers disposed between the first surface and the second surface in each of the first portion of the conduits.

9. A plasma generator plate within a substrate processing chamber comprising:
   a first side;
   a second side;
   a first conduit passing from the first side to the second side through a first transformer core within the plasma generator plate;
   a second conduit passing from the first side to the second side through a second transformer core; and
   a third conduit passing from the first side to the second side not passing through a transformer core.

10. The plasma generator plate of claim 9 further comprising a first dielectric spacer in a first secondary current path around the first transformer core.

* * * * *